(12) United States Patent
Takahashi et al.

(10) Patent No.: US 8,889,025 B2
(45) Date of Patent: Nov. 18, 2014

(54) ETCHING COMPOSITION

(71) Applicants: FUJIFILM Corporation, Tokyo (JP); Fujifilm Electronic Materials U.S.A., Inc., North Kingstown, RI (US)

(72) Inventors: Tomonori Takahashi, Mesa, AZ (US); Tadashi Inaba, Shizuoka (JP); Atsushi Mizutani, Shizuoka (JP); Bing Du, Gilbert, AZ (US); William A. Wojtczak, Austin, TX (US); Kazutaka Takahashi, Shizuoka (JP); Tetsuya Kamimura, Shizuoka (JP)

(73) Assignees: Fujifilm Electronic Materials U.S.A., Inc., N. Kingstown, RI (US); FujiFilm Corporation, Tokyo (JP)

(*) Notice: Subject to any disclaimer, the term of this patent is extended or adjusted under 35 U.S.C. 154(b) by 0 days.

(21) Appl. No.: 14/146,142

(22) Filed: Jan. 2, 2014

(65) Prior Publication Data
US 2014/0120734 A1    May 1, 2014

Related U.S. Application Data

(63) Continuation of application No. 13/415,390, filed on Mar. 8, 2012, now Pat. No. 8,647,523.

(60) Provisional application No. 61/451,910, filed on Mar. 11, 2011, provisional application No. 61/540,850, filed on Sep. 29, 2011.

(51) Int. Cl.
| | |
|---|---|
| C03C 15/00 | (2006.01) |
| H01L 21/3213 | (2006.01) |
| C09K 13/06 | (2006.01) |
| C23F 1/16 | (2006.01) |
| C23F 1/30 | (2006.01) |
| H01L 21/285 | (2006.01) |
| H01L 21/768 | (2006.01) |

(52) U.S. Cl.
CPC .......... *H01L 21/32134* (2013.01); *C09K 13/06* (2013.01); *C23F 1/16* (2013.01); *C23F 1/30* (2013.01); *H01L 21/28518* (2013.01); *H01L 21/76843* (2013.01)
USPC .................................. 216/83; 216/37; 216/67

(58) Field of Classification Search
USPC ....................... 216/37, 67, 84; 252/79.1–79.4
See application file for complete search history.

(56) References Cited

U.S. PATENT DOCUMENTS

| | | | |
|---|---|---|---|
| 4,271,965 A | * | 6/1981 | Brambley et al. ............ 206/219 |
| 4,285,761 A | | 8/1981 | Fatula, Jr. et al. |

(Continued)

FOREIGN PATENT DOCUMENTS

| | | |
|---|---|---|
| CN | 102290325 | 12/2011 |
| DE | 4100839 | 7/1992 |

(Continued)

OTHER PUBLICATIONS

International Search Report and Written Opinion issued in International Application No. PCT/US2013/052863 dated Jan. 17, 2014 (13 pages).

(Continued)

*Primary Examiner* — Nadine Norton
*Assistant Examiner* — Maki Angadi
(74) *Attorney, Agent, or Firm* — Fish & Richardson P.C.

(57) ABSTRACT

This disclosure relates to a method for manufacturing a semiconductor device. The method includes etching a metal film on a semiconductor substrate with an etching composition; and rinsing the etched metal film with a rinse solvent. The etching composition includes at least one acid; at least one compound containing a halide anion, the halide anion being chloride or bromide; at least one compound containing a nitrate or nitrosyl ion; and water.

21 Claims, 1 Drawing Sheet

(56) References Cited

U.S. PATENT DOCUMENTS

| | | | |
|---|---|---|---|
| 4,632,727 A | 12/1986 | Nelson | |
| 4,804,438 A | 2/1989 | Rhodes | |
| 4,944,851 A | 7/1990 | Cordani et al. | |
| 5,232,563 A | 8/1993 | Warfield | |
| 5,326,724 A | 7/1994 | Wei | |
| 5,514,293 A | 5/1996 | Shimakura et al. | |
| 5,591,354 A | 1/1997 | Patel et al. | |
| 5,755,950 A | 5/1998 | Bell | |
| 5,977,581 A | 11/1999 | Thakur et al. | |
| 6,221,746 B1 | 4/2001 | Huang et al. | |
| 6,407,047 B1 | 6/2002 | Mehta et al. | |
| 6,494,960 B1 | 12/2002 | Macdonald et al. | |
| 6,630,433 B2 | 10/2003 | Zhang et al. | |
| 6,703,291 B1 | 3/2004 | Boyanov et al. | |
| 7,238,291 B2 | 7/2007 | Onsia et al. | |
| 7,268,430 B2 * | 9/2007 | Suga et al. | 257/737 |
| 7,344,978 B2 | 3/2008 | Chang et al. | |
| 7,517,765 B2 | 4/2009 | Brunco et al. | |
| 7,790,624 B2 | 9/2010 | Sharma | |
| 7,951,653 B1 | 5/2011 | Park et al. | |
| 2001/0054706 A1 | 12/2001 | Levert et al. | |
| 2003/0198889 A1 | 10/2003 | Iwasa et al. | |
| 2004/0099637 A1 | 5/2004 | Johnson et al. | |
| 2004/0169013 A1 | 9/2004 | Kool et al. | |
| 2005/0050803 A1 | 3/2005 | Amanokura et al. | |
| 2005/0070098 A1 | 3/2005 | Bruley et al. | |
| 2005/0178742 A1 | 8/2005 | Chelle et al. | |
| 2006/0051961 A1 | 3/2006 | Cabral, Jr. et al. | |
| 2006/0201360 A1 | 9/2006 | Andriessen et al. | |
| 2006/0226122 A1 | 10/2006 | Wojtczak et al. | |
| 2007/0009449 A1 | 1/2007 | Kanca | |
| 2007/0015360 A1 | 1/2007 | Lu et al. | |
| 2007/0020925 A1 | 1/2007 | Hsieh et al. | |
| 2007/0111356 A1 | 5/2007 | Wilson et al. | |
| 2007/0161246 A1 | 7/2007 | Obeng et al. | |
| 2008/0045035 A1 | 2/2008 | Lee et al. | |
| 2008/0073614 A1 * | 3/2008 | Akiyama et al. | 252/79.3 |
| 2008/0116170 A1 | 5/2008 | Collins et al. | |
| 2008/0210900 A1 | 9/2008 | Wojtczak et al. | |
| 2008/0224232 A1 | 9/2008 | Hsieh et al. | |
| 2008/0274611 A1 | 11/2008 | Cabral et al. | |
| 2009/0212021 A1 | 8/2009 | Bernhard et al. | |
| 2009/0261291 A1 | 10/2009 | Banerjee et al. | |
| 2009/0280641 A1 | 11/2009 | Kang et al. | |
| 2009/0309228 A1 | 12/2009 | Fang et al. | |
| 2010/0079924 A1 | 4/2010 | Keating et al. | |
| 2010/0089872 A1 | 4/2010 | Ihara et al. | |
| 2010/0261632 A1 | 10/2010 | Korzenski et al. | |
| 2011/0146724 A1 | 6/2011 | Lee | |
| 2012/0091100 A1 | 4/2012 | Bedell et al. | |
| 2012/0231632 A1 | 9/2012 | Takahashi et al. | |

FOREIGN PATENT DOCUMENTS

| | | | | |
|---|---|---|---|---|
| DE | 100 39 684 | 5/2001 | | C23F 1/28 |
| DE | 102009045114 | 3/2011 | | |
| KR | 2003-0004861 | 1/2003 | | C23C 18/16 |
| TW | 1293988 | 7/1994 | | |
| WO | WO2012017819 | 2/2012 | | |
| WO | WO2012097143 | 7/2012 | | |

OTHER PUBLICATIONS

International Search Report and the Written Opinion issued in International Application No. PCT/US12/28249 on Aug. 16, 2012.

International Search Report and Written Opinion issued in International Application No. PCT/US12/61355 on Dec. 27, 2012.

* cited by examiner

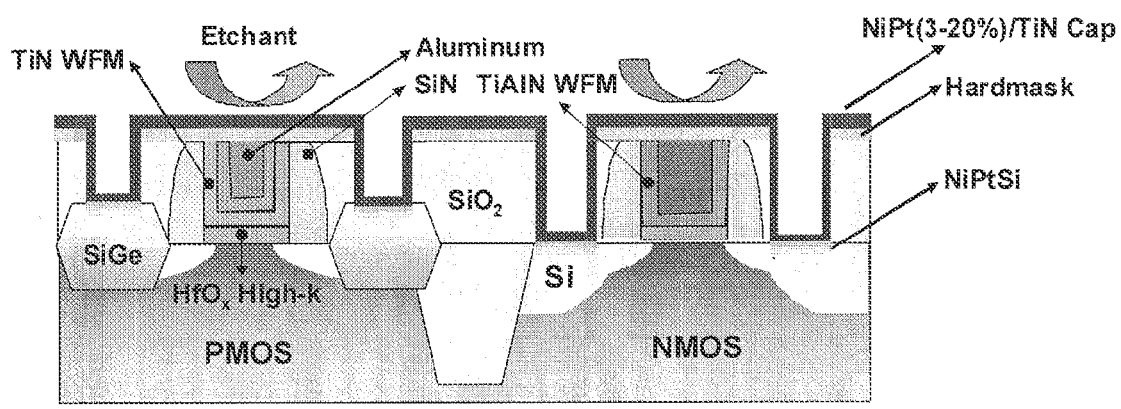

ETCHING COMPOSITION

CROSS-REFERENCE TO RELATED APPLICATIONS

The present application is a continuation of U.S. application Ser. No. 13/415,390, filed on Mar. 8, 2012, which claims priority to U.S. Provisional Application Ser. No. 61/451,910, filed on Mar. 11, 2011 and U.S. Provisional Application Ser. No. 61/540,850, filed on Sep. 29, 2011. The contents of the parent applications are hereby incorporated by reference in their entirety.

FIELD OF THE DISCLOSURE

The present disclosure relates to semiconductor device manufacturing, and particularly to selective metal wet etching compositions and processes for selectively etching certain metals relative to adjacent structures and materials with those etching compositions. More particularly, the present disclosure relates to aqueous metal etching compositions and processes for use in the presence of one or more of aluminum, and nickel platinum silicides.

BACKGROUND TO THE DISCLOSURE

Integrated circuit manufacture is a multi-step construction process. The process entails repetitive steps of lithography to selectively expose underlying layers, etching of partially or completely exposed layers, and deposition of layers or filling of gaps frequently produced by etching or selective deposition of materials. Etching of metals is a critical process step. Frequently metals must be selectively etched in the presence of other metals, metal alloys, and/or non metal materials without corroding, etching, or oxidizing the adjacent materials. As the dimensions of the features in the integrated circuit become increasingly smaller, the importance of minimizing corrosion, etching, oxidizing, or other damage to adjacent materials and features increases.

The structural features and compositions of the other metals, metal alloys, and non metal materials may vary depending on the particular device so that prior art compositions may not etch the specific metal without damaging the materials in adjacent structures. Combinations of particular adjacent materials may also affect the type and amount of damage produced in an etching step. Thus it is often not obvious which etch composition is appropriate for a given device structure and adjacent materials. It is an objective of this disclosure to provide etching compositions which are suitable to selectively etch selected metals with little or no damage to adjacent materials and structures.

SUMMARY OF THE DISCLOSURE

In one aspect, this disclosure features a composition for etching a metal film (e.g., a Ni or NiPt film). The etching composition contains at least one sulfonic acid, about 0.01% to about 0.5% of at least one halide anion selected from the group consisting of chloride and bromide, at least one compound containing a nitrate or nitrosyl ion, corresponding counter ions for the halide and nitrate anions (or nitrosyl cation), and water.

In some embodiments, the etching composition contains A) about 25% to about 95% (e.g., about 60% to about 95%) of at least one sulfonic acid, B) about 0.01% to about 0.5% of at least one halide anion selected from the group consisting of chloride and bromide, C) about 0.1% to about 20% of at least one nitrate anion or a nitrosyl cation, D) corresponding counter ions for the halide and nitrate anions (or nitrosyl cation), and E) at least about 3% water.

In another aspect, this disclosure features a kit containing at least one sulfonic acid in a first container; at least one compound containing a halide ion in a second container, the halide ion being chloride or bromide; and at least one compound containing a nitrate or nitrosyl ion in a third container. The second container is different from the third container. In some embodiments, the first container is the same as the second or third container. In some embodiments, the first container is different from the second and third containers.

In some embodiments, this disclosure concerns a kit containing, in two or optionally, three containers, the following reagents for forming an etching composition for microelectronic device manufacture: a) at least one sulfonic acid, b) at least one halide anion wherein the halide is selected from the group consisting of bromide and chloride, c) at least one nitrate anion or nitrosyl cation or mixtures thereof, d) corresponding counter ions for the halide and nitrate anions (or nitrosyl cation), and e) water with the proviso that the at least one nitrate anion or nitrosyl cation and the at least one halide anion are in different containers.

In still another aspect, this disclosure features a method that includes etching a metal film on a semiconductor substrate with an etching composition described herein; and rinsing the etched metal film with a rinse solvent.

In some embodiments, this disclosure concerns a metal etching process that includes (a) providing a semiconductor substrate having a metal film partially or completely exposed to a composition of this disclosure and etchable by it; (b) contacting the metal film to be etched with a composition of this disclosure, and (c) rinsing the etched semiconductor substrate with solvent containing water.

BRIEF DESCRIPTION OF DRAWING

FIG. 1 is representative illustration of a partially completed device just prior to removal of the TiN protective cap and the subsequent etch of NiPt using an etching composition described in this disclosure.

DETAILED DESCRIPTION OF THE DISCLOSURE

The numerical limits (i.e., the upper and lower limits) of the ranges and ratios described herein can be combined. The ranges described herein include all intermediate values within the ranges. In other words, all intermediate values within the ranges described herein are deemed to be disclosed by the disclosure of the ranges. All possible combinations of the various disclosed elements are deemed to be included within the scope of the present disclosure unless specifically excluded.

Unless otherwise stated, % is weight %. All temperatures are measured in Celsius degrees, unless otherwise stated.

The term "essentially free" in the context of this disclosure is defined to mean that none of the specified compounds is intentionally added to a formulation. The specified compounds, if present, are only contaminants in negligible amounts that would not materially affect the properties of a formulation.

In some embodiments, this disclosure concerns an etching composition (e.g., an aqueous composition) containing A) at least one sulfonic acid, B) at least one halide anion selected from the group consisting of chloride and bromide, the at least one halide anion being about 0.01% to about 0.5% of the composition, C) at least one nitrate or nitrosyl ion, D) corresponding counter ions for the halide and nitrate anions (or nitrosyl cation), and E) water.

One or more sulfonic acids may be employed in the etching compositions of this disclosure. The sulfonic acids may be a solid or a liquid at room temperature as long as the final composition is a homogeneous liquid. Liquid or low melting solid sulfonic acids work effectively.

Preferred sulfonic acids are described by $R^1SO_3H$ (Formula (1)) or by Formula (2). In Formula (1), $R^1$ can be substituted or unsubstituted $C_1$-$C_{12}$ linear or branched alkyl, substituted or unsubstituted $C_3$-$C_{12}$ cyclic alkyl, $C_1$-$C_{12}$ linear or branched perfluoroalkyl, $C_3$-$C_{12}$ cyclic perfluoroalkyl, $C_1$-$C_{12}$ linear or branched fluoroalkyl ether, $C_3$-$C_{12}$ cyclic fluoroalkyl ether, or substituted or unsubstituted $C_7$-$C_{12}$ alicyclic. Examples of substituents include $C_1$-$C_4$ alkyl groups, sulfonic acid groups, phenyl groups, $C_1$-$C_4$ alkylphenyl groups, hydroxyphenyl groups, and halogen (e.g., fluorine). In Formula (2), $R^2$, $R^3$, and $R^4$ are independently selected from the group consisting of $C_1$-$C_{12}$ linear or branched alkyl, $C_3$-$C_{12}$ cyclic alkyl, Cl, Br, F, OH, $NO_2$, $SO_3H$, and $CO_2H$; $R^5$=H; and a, b, c, and n are integers selected from the group consisting of 0, 1, 2, and 3 with the relationship a+b+c=n.

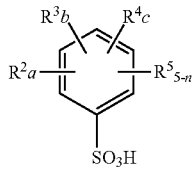

Formula (2)

In some embodiments, preferred sulfonic acids of Formula (1) are those wherein $R^1$ is substituted or unsubstituted $C_1$-$C_4$ linear or branched alkyl, $C_1$-$C_4$ linear or branched perfluoroalkyl, $C_4$-$C_6$ linear or branched fluoroalkyl ether, and substituted or unsubstituted $C_7$-$C_{10}$ alicyclic groups.

In some embodiments, more preferred sulfonic acids of Formula (1) are those wherein $R^1$ is substituted or unsubstituted $C_1$-$C_4$ linear or branched alkyl or $C_1$-$C_4$ linear or branched perfluoroalkyl.

In some embodiments, the most preferred sulfonic acids of Formula (1) are those wherein $R^1$ is substituted or unsubstituted $C_1$-$C_2$ alkyl or $C_1$-$C_2$ perfluoroalkyl.

In some embodiments, preferred sulfonic acids of Formula (2) are those wherein $R^2$, $R^3$, and $R^4$ are $C_1$-$C_4$ linear or branched alkyl, Cl, $NO_2$, OH, $SO_3H$, F, and $CO_2H$, where n is an integer selected from the group consisting of 0, 1 and 2.

In some embodiments, more preferred sulfonic acids of Formula (2) are those wherein $R^2$, $R^3$, and $R^4$ are $C_1$-$C_4$ linear or branched alkyl, Cl, $NO_2$, OH, $SO_3H$, F, and $CO_2H$, where n is an integer selected from the group consisting of 0 and 1.

In some embodiments, the most preferred sulfonic acids of Formula (2) are those wherein $R^2$, $R^3$, and $R^4$ are $C_1$-$C_2$ alkyl, Cl, $NO_2$, OH, F, and $CO_2H$, where n is an integer selected from the group consisting of 0 and 1.

Examples of sulfonic acids of Formula (1) include, but are not limited to, methanesulfonic acid, trifluoromethanesulfonic acid, ethanesulfonic acid, trifluoroethanesulfonic acid, perfluoroethylsulfonic acid, perfluoro(ethoxyethane) sulfonic acid, perfluoro(methoxyethane)sulfonic acid, dodecylsulfonic acid, perfluorododecylsulfonic acid, butanesulfonic acid, perfluorobutanesulfonic acid, propanesulfonic acid, perfluoropropanesulfonic acid, octylsulfonic acid, peflourooctanesulfonic acid, methanedisulfonic acid, 2-methylpropanesulfonic acid, cyclohexylsulfonic acid, camphorsulfonic acids, perfluorohexanesulfonic acid, ethanedisulfonic acid, benzylsulfonic acid, hydroxyphenylmethanesulfonic acid, naphthylmethanesulfonic acid, and norbornanesulfonic acids.

In some embodiments, preferred examples of sulfonic acids of Formula (1) include, but are not limited to, methanesulfonic acid, trifluoromethanesulfonic acid, ethanesulfonic acid, trifluoroethanesulfonic acid, perfluoroethylsulfonic acid, perfluoro(ethoxyethane)sulfonic acid, perfluoro(methoxyethane)sulfonic acid, butanesulfonic acid, perfluorobutanesulfonic acid, propanesulfonic acid, perfluoropropanesulfonic acid, methanedisulfonic acid, 2-methylpropanesulfonic acid, camphorsulfonic acids, ethanedisulfonic acid, benzylsulfonic acid, hydroxyphenylmethanesulfonic acid, naphthylmethanesulfonic acid, and norbornanesulfonic acids.

In some embodiments, more preferred examples of sulfonic acids of Formula (1) include, but are not limited to, methanesulfonic acid, trifluoromethanesulfonic acid, ethanesulfonic acid, trifluoroethanesulfonic acid, perfluoroethylsulfonic acid, butanesulfonic acid, perfluorobutanesulfonic acid, propanesulfonic acid, perfluoropropanesulfonic acid, methanedisulfonic acid, 2-methylpropanesulfonic acid, ethanedisulfonic acid, benzylsulfonic acid, hydroxyphenylmethanesulfonic acid, and naphthylmethanesulfonic acid.

In some embodiments, the most preferred examples of sulfonic acids of Formula (1) include, but are not limited to, methanesulfonic acid, trifluoromethanesulfonic acid, ethanesulfonic acid, trifluoroethanesulfonic acid, perfluoroethylsulfonic acid, methanedisulfonic acid, and ethanedisulfonic acid.

Examples of sulfonic acids of Formula (2) include, but are not limited to, benzenesulfonic acid, chlorobenzenesulfonic acids, bromobenzenesulfonic acids, fluorobenzenesulfonic acids, hydroxybenzenesulfonic acids, nitrobenzenesulfonic acids, 2-hydroxy-5-sulfobenzoic acid, benzenedisulfonic acids, toluenesulfonic acids, methylchlorobenzenesulfonic acids, dodecylbenzenesulfonic acids, butylbenzenesulfonic acids, cyclohexylbenzenesulfonic acids, picrylsulfonic acid, dichlorobenzenesulfonic acids, dibromobenzenesulfonic acids, and 2,4,5-trichlorobenzenesulfonic acid.

In some embodiments, preferred examples of sulfonic acids of Formula (2) include, but are not limited to, benzenesulfonic acid, chlorobenzenesulfonic acids, fluorobenzenesulfonic acids, hydroxybenzenesulfonic acids, nitrobenzenesulfonic acids, 2-hydroxy-5-sulfobenzoic acid, benzenedisulfonic acids, toluenesulfonic acids, methylchlorobenzenesulfonic acids, butylbenzenesulfonic acids, and dichlorobenzenesulfonic acids.

In some embodiments, more preferred examples of sulfonic acids of Formula (2) include, but are not limited to, benzenesulfonic acid, chlorobenzenesulfonic acids, fluorobenzenesulfonic acids, hydroxybenzenesulfonic acids, nitrobenzenesulfonic acids, benzenedisulfonic acids, toluenesulfonic acids, and butylbenzenesulfonic acids.

In some embodiments, more preferred examples of sulfonic acids of Formula (2) include, but are not limited to, benzenesulfonic acid, chlorobenzenesulfonic acids, fluorobenzenesulfonic acids, hydroxybenzenesulfonic acids, nitrobenzenesulfonic acids, and toluenesulfonic acids.

In some embodiments, the at least one sulfonic acid includes a mixture of one or more of a first sulfonic acid and one or more of a second sulfonic acid having higher hydrophobicity than the at least one first sulfonic acid. The first sulfonic acid can be selected from the group consisting of acids of Formula (1): $R^1SO_3H$, where $R^1$ is an unsubstituted $C_1$-$C_4$ linear or branched alkyl.

The second sulfonic acid can be selected from the group consisting of sulfonic acids of formula (2):

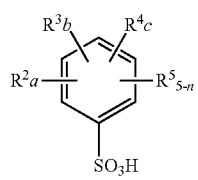

Formula (2)

In Formula (2), $R^2$, $R^3$, and $R^4$ are independently selected from the group consisting of $C_1$-$C_{12}$ linear or branched alkyl, $C_3$-$C_{12}$ cyclic alkyl, Cl, Br, F; $R^5$ is H; and a, b, c, and n are integers selected from the group consisting of 0, 1, 2, and 3 with the relationship a+b+c=n.

The second sulfonic acid can also be a compound of Formula (1): $R^1SO_3H$, where R' is substituted or unsubstituted $C_6$-$C_{12}$ linear or branched alkyl, substituted or unsubstituted $C_6$-$C_{12}$ cyclic alkyl, $C_1$-$C_{12}$ linear or branched perfluoroalkyl, $C_3$-$C_{12}$ cyclic perfluoroalkyl, $C_1$-$C_{12}$ linear or branched fluoroalkyl ether, $C_3$-$C_{12}$ cyclic fluoroalkyl ether, or substituted or unsubstituted $C_7$-$C_{12}$ alicyclic groups. Examples of substituents include, but are not limited to, $C_1$-$C_4$ alkyl groups, phenyl groups, and fluorine atoms. In such embodiments, hydrophilic groups (e.g., OH, COOH, $SO_3H$, or $NO_2$) can be excluded from substituents suitable for the second sulfonic acid.

Examples of the first sulfonic acids of Formula (1) include, but are not limited to, methanesulfonic acid, ethanesulfonic acid, propanesulfonic acid, and butanesulfonic acid.

Examples of the second sulfonic acids of Formula (2) include, but are not limited to, benzenesulfonic acid, chlorobenzenesulfonic acids, bromobenzenesulfonic acids, fluorobenzenesulfonic acids, toluenesulfonic acids, methylchlorobenzenesulfonic acids, dodecylbenzenesulfonic acids, butylbenzenesulfonic acids, cyclohexylbenzenesulfonic acids, dichlorobenzenesulfonic acids, dibromobenzenesulfonic acids, and 2,4,5-trichlorobenzenesulfonic acid.

Other sulfonic acids suitable as the second sulfonic acid include, but are not limited to, trifluoromethanesulfonic acid, trifluoroethanesulfonic acid, perfluoroethylsulfonic acid, perfluoro(ethoxyethane)sulfonic acid, perfluoro(methoxyethane)sulfonic acid, dodecylsulfonic acid, perfluorododecylsulfonic acid, perfluorobutanesulfonic acid, perfluoropropanesulfonic acid, octylsulfonic acid, pefluorooctanesulfonic acid, cyclohexylsulfonic acid, camphorsulfonic acids, perfluorohexanesulfonic acid, benzylsulfonic acid, naphthylmethanesulfonic acid, and norbornanesulfonic acid, Preferred sulfonic acids suitable as the second sulfonic acid are those of Formula (1) where $R^1$ is $C_1$-$C_{12}$ linear or branched perfluoroalkyl and those of Formula (2) where $R^2$ is $C_1$-$C_{12}$ linear or branched alkyl, a is 1, and b and c are 0.

In some embodiments, the at least one sulfonic acid is a naphthalenesulfonic acid, which is optionally substituted with a $C_1$-$C_{12}$ linear or branched alkyl group or $SO_3H$. Examples of substituted or unsubstituted naphthalenesulfonic acid include, but are not limited to, 1-naphthalenesulfonic acid, 2-naphthalenesulfonic acid, 8-methyl-1-napthalenesulfonic acid, 5-methyl-2-napthalenesulfonic acid, 3-methyl-2-napthalenesulfonic acid, 4-methyl-1-napthalenesulfonic acid, and 1,5-naphthalenedisulfonic acid.

In some embodiments, the at least one sulfonic acid is a mixture of one or more of the first sulfonic acid of Formula (1) described above and one or more of a second sulfonic acid in which the second sulfonic acid is a naphthalenesulfonic acid optionally substituted with a $C_1$-$C_{12}$ alkyl group or $SO_3H$.

In some embodiments, the first sulfonic acid and the second sulfonic acid are employed in a ratio of from about 10:1 to about 150:1. In some embodiments, the first sulfonic acid and the second sulfonic acid are employed in a ratio of from about 20:1 to about 60:1. In some embodiments, the first sulfonic acid and the second sulfonic acid are employed in a ratio of from about 30:1 to about 40:1.

Performance of the etching compositions described herein can be optimized based on the specific metals present on the device being etched, and the relative hydrophobicity and acidity of the first and second sulfonic acids being employed.

The etching compositions of this disclosure employ one or more sources of halide anion selected from chloride or bromide anions. Mixtures may contain chloride anions from the same or different classes of compounds, bromide anions from the same or different classes of compounds, or may contain both chloride and bromide anions from the same or different classes of compounds.

Any suitable source of ionic chloride or bromide compounds may be employed in the compositions of this disclosure. Care should be taken that the chloride (bromide) does not contain groups unstable to the strong acid conditions. Suitable sources of ionic chloride and bromide include, but are not limited to, hydrogen chloride (bromide), ammonium chloride (bromide), quaternary ammonium chlorides (bromides), amine hydrochlorides (hydrobromides), nitrogen based aromatic and pseudoaromatic hydrochlorides (hydrobromides), phosphonium chlorides (bromides), and metal chlorides (bromides).

In some embodiments, preferred sources of ionic bromides and chlorides include, but are not limited to, hydrogen chloride, hydrogen bromide, ammonium chloride, ammonium bromide, quaternary ammonium chlorides, quaternary ammonium bromides, amine hydrochlorides, amine hydrobromides, nitrogen based aromatic and pseudoaromatic hydrochlorides, and nitrogen based aromatic and pseudoaromatic hydrobromides.

In some embodiments, more preferred sources of ionic bromides and chlorides include, but are not limited to, hydrogen chloride, hydrogen bromide, ammonium chloride, ammonium bromide, quaternary ammonium chlorides, quaternary ammonium bromides, and nitrogen based aromatic and pseudoaromatic hydrochlorides, and nitrogen based aromatic and pseudoaromatic hydrobromides.

In some embodiments, the most preferred sources of ionic bromides and chlorides include, but are not limited to, hydrogen chloride, ammonium chloride, ammonium bromide, and quaternary ammonium chlorides.

Examples of quaternary ammonium chlorides (bromides) include, but are not limited to, those compounds described by $R^1R^2R^3R^4N^+Cl^-$ ($Br^-$) where $R^1$, $R^2$, $R^3$, and $R^4$ independently are substituted or unsubstituted alkyl or phenyl. Examples of $R^1$, $R^2$, $R^3$, and $R^4$ include, but are not limited to, methyl, ethyl, propyl, butyl, pentyl, octyl, decyl, and phenyl. Examples of substituents include, but are not limited to, fluoride, $C_1$-$C_4$ alkyl, and substituted or unsubstituted phenyl. Preferred quaternary ammonium chlorides (bromides) are where $R^1$, $R^2$, $R^3$, and $R^4$ are $C_1$-$C_4$ alkyl. More preferred quaternary ammonium chlorides (bromides) are where $R^1$, $R^2$, $R^3$, and $R^4$ are $C_1$-$C_2$ alkyl.

Specific examples of quaternary ammonium chlorides include, but are not limited to, tetramethylammonium chloride, ethyltrimethylammonium chloride, diethyldimethyl ammonium chloride, methyltriethylammonium chloride, tetraethylammonium chloride, phenyltrimethyl ammonium chloride, dimethyldiphenylammonium chloride, benzyl trimethylammonium chloride, tetrapropylammonium chloride, tetrabutylammonium chloride, dimethyldibutylammonium chloride, decyltrimethylammonium chloride, pentyltrimethylammonium chloride, tetra-isopropylammonium chloride, decyltrimethylammonium chloride, 2,2,2-trifluoroethyltrimethylammonium chloride, fluorophenyl trimethyl ammonium chloride, chlorophenyltrimethylammonium chloride, and methylphenyltrimethylammonium chloride. Tetramethylammonium chloride, tetraethylammonium chloride, methyltriethylammonium chloride, ethyltrimethylammonium chloride are preferred from this class of chlorides.

Specific examples of quaternary ammonium bromides include, but are not limited to, tetramethylammonium bromide, methyltriethylammonium bromide, diethyldimethyl ammonium bromide, ethyltrimethylammonium bromide, tetraethylammonium bromide, phenyltrimethyl ammonium bromide, dimethyldiphenylammonium bromide, benzyl trimethylammonium bromide, tetrapropylammonium bromide, tetrabutylammonium bromide, dimethyldibutylammonium bromide, decyltrimethylammonium bromide, pentyltrimethylammonium bromide, tetra-isopropylammonium bromide, decyltrimethylammonium bromide, 2,2,2-trifluoroethyltrimethylammonium bromide, fluorophenyl trimethyl ammonium bromide, chlorophenyltrimethylammonium bromide, and methylphenyltrimethylammonium bromide. Tetramethylammonium bromide, tetraethylammonium bromide, methyltriethylammonium bromide, ethyltrimethylammonium bromide are preferred from this class of bromides.

Examples of amine hydrochlorides (hydrobromides) include, but are not limited to, the reaction products of HCl (HBr) with mono-, di-, and trisubstituted amine compounds, which contain 1 or more amine functional groups. Suitable amine compounds include, but are not limited to, methylamine, dimethylamine, trimethylamine, ethylamine, diethylamine, triethylamine, propylamine, dipropylamine, tripropylamine, pyrrolidine, piperidine, ethylmethylamine, ethyldimethylamine, phenylamine, diphenylamine, methyldiphenylamine, dimethylphenylamine, triphenylamine, benzylamine, benzylmethylamine, dibenzylamine, butylamine, dibutylamine, tributylamine, ethylenediamine, triethylenediamine, diethylenetriamine, aniline, dimethylaniline, methylaniline, phenylenediamine, piperazine, and bis-(aminophenyl)methane.

Examples of nitrogen based aromatic and pseudoaromatic hydrochlorides (hydrobromides), include, but are not limited to, the reaction products of HCl (HBr) with pyridine, pyrrole, pyrazole, imidazole, pyrazine, pyrimidine, and their substituted derivatives.

Examples of phosphonium chlorides include tetramethylphosphonium chloride, tetraethylphosphonium chloride, tetrapropylphosphonium chloride, tetrabutylphosphonium choride, dimethyldiethylphosphonium chloride, phenyltrimethylphosphonium chloride, and fluorophenyltrimethylphosphonium chloride.

Examples of phosphonium bromides include tetramethylphosphonium bromide, tetraethylphosphonium bromide, tetrapropylphosphonium bromide, tetrabutylphosphonium bromide, dimethyldiethylphosphonium bromide, phenyltrimethylphosphonium bromide, and fluorophenyltrimethylphosphonium bromide.

Examples of metal chlorides include sodium chloride, lithium chloride, copper chloride, iron chloride, magnesium chloride, nickel chloride, palladium chloride, platinum chloride, tin chloride, and zinc chloride. Examples of metal bromides include sodium bromide, lithium bromide, copper bromide, iron bromide, magnesium bromide, nickel bromide, palladium bromide, platinum bromide, tin bromide, and zinc bromide. For example, the chlorides (bromides) of the specific metal being etched may be added in a buffering approach. The metal chloride may provide some small equilibrium amount of unbound chloride (bromide).

One or more nitrates may be employed from the same or different classes. Similarly, one or more nitrosyl salts from the same or different classes may be employed. Alternatively, a mixture(s) of nitrate(s) and nitrosyl salt(s) from the same or different classes may be employed.

Any suitable source of ionic nitrate anions or nitrosyl salts may be employed in the compositions of this disclosure. Suitable ionic nitrate sources include, but are not limited to, nitric acid, ammonium nitrate, quaternary ammonium nitrates, substituted ammonium nitrates, nitrogen based aromatic and pseudoaromatic reaction products with nitric acid, phosphonium nitrates, and metal nitrates.

In some embodiments, preferred sources of ionic nitrate and nitrosyl salts include, but are not limited to, nitric acid, ammonium nitrate, quaternary ammonium nitrates, nitrogen based aromatic and pseudoaromatic reaction products with nitric acid. More preferred sources of ionic nitrate and nitrosyl salts include, but are not limited to, nitric acid, ammonium nitrate, and quaternary ammonium nitrates. The most preferred sources of ionic nitrate are nitric acid and ammonium nitrate.

Specific examples of quaternary ammonium nitrates include, but are not limited to, tetramethylammonium nitrate, ethyltrimethylammonium nitrate, diethyldimethyl ammonium nitrate, methyltriethylammonium nitrate, tetraethylammonium nitrate, phenyltrimethyl ammonium nitrate, dimethyldiphenylammonium nitrate, benzyl trimethylammonium nitrate, tetrapropylammonium nitrate, tetrabutylammonium nitrate, dimethyldibutylammonium nitrate, decyltrimethylammonium nitrate, pentyltrimethylammonium nitrate, tetra-isopropylammonium nitrate, decyltrimethylammonium nitrate, 2,2,2-trifluoroethyltrimethylammonium nitrate, fluorophenyl trimethyl ammonium nitrate, chlorophenyltrimethylammonium nitrate, and methylphenyltrimethylammonium nitrate. Tetramethylammonium nitrate, tetraethylammonium nitrate, methyltriethylammonium nitrate, ethyltrimethylammonium nitrate are preferred from this class of nitrates.

Examples of substituted ammonium nitrates include, but are not limited to, the reaction products of nitric acid with mono-, di-, and trisubstituted amine compounds, which contain 1 or more amine functional groups. Suitable amine compounds include, but are not limited to, methylamine, dimethylamine, trimethylamine, ethylamine, diethylamine, triethylamine, propylamine, dipropylamine, tripropylamine, pyrrolidine, piperidine, ethylmethylamine, ethyldimethylamine, phenylamine, diphenylamine, methyldiphenylamine, dimethylphenylamine, triphenylamine, benzylamine, benzylmethylamine, dibenzylamine, butylamine, dibutylamine, tributylamine, ethylenediamine, triethylenediamine, diethylenetriamine, aniline, dimethylaniline, methylaniline, phenylenediamine, piperazine, and bis-(aminophenyl)methane.

Examples of nitrogen based aromatic and pseudoaromatic reaction products with nitric acid, include, but are not limited to, the reaction products of nitric acid with pyridine, pyrole, pyrazole, imidazole, pyrazine, pyrimidine, and their substituted derivatives.

Examples of phosphonium nitrates include tetramethylphosphonium nitrate, tetraethylphosphonium nitrate, tetrapropylphosphonium nitrate, tetrabutylphosphonium nitrate, dimethyldiethylphosphonium nitrate, phenyltrimethylphosphonium nitrate, and fluorophenyltrimethylphosphonium nitrate.

Examples of metal nitrates include sodium nitrate, lithium nitrate, copper nitrates, iron nitrates, magnesium nitrate, nickel nitrate, palladium nitrate, platinum nitrate, tin nitrate, and nitrate. While these compounds can be employed in the etching compositions described herein, the use of metal nitrates are not preferred in semiconductor applications because of the potential for contamination of the semiconductor device.

Suitable nitrosyl salts include nitrosyl chloride, nitrosyl bromide, nitrosyl fluoride, nitrosyl tetrafluoroborate, and nitrosyl hydrogen sulfate. Nitrosyl hydrogen sulfate and nitrosyl tetrafluoroborate are preferred. Nitrosyl hydrogen sulfate is more preferred.

Water (preferably deionized water), cations for the nitrate and chloride (bromide), anions for the nitrosyl, and optional additives complete the etching composition of this disclosure. Water is at least about 3% of the etching composition so that the etching occurs and the products are dissolved in the etching composition. The water source may be from the acid, the chloride (bromide) source, the nitrate source, or added additionally to any water provided by those sources.

Without wishing to be bound by theory, it is believed that the nitrate source on reaction with the chloride source in a strongly acidic environment forms the oxidizing NO (nitrosyl) halide intermediate. The nitrosyl cation oxidizes the metals and the free halide ions ionized in the aqueous composition complex the metal ions and assist in their dissolution. The soluble metal salts are believed to be coordination compounds with chloride in the coordination sphere. The water is believed to solubilize the inorganic metal salts. The sulfonic acids are used to maintain a low pH for effective formation of the nitrosyl halide at low concentrations of halide and nitrate, and for assistance in dissolution of the metal salts.

In some embodiments of the disclosure, the aqueous etching composition is essentially free of fluoride anions (i.e., $F^-$). In some embodiments of the disclosure, the aqueous etching composition is essentially free of abrasives. In some embodiments of the disclosure, the aqueous etching composition is essentially free of both fluoride anions and abrasives. In some embodiments of the disclosure, the aqueous etching composition is essentially free of aromatic nitro compounds, thiocarbonyl compounds, and/or metal ions (except for those metals being etched).

In some embodiments, the sulfonic acid is about 25%-95% of the aqueous etching composition described herein. In some embodiments, the sulfonic acid is about 60%-95% of the aqueous etching composition. In some embodiments, the sulfonic acid is about 60%-80% of the aqueous etching composition. In some embodiments, the sulfonic acid is about 60%-75% of the aqueous etching composition. In some embodiments, the sulfonic acid is about 65%-95% (e.g., about 70%-95%, about 75%-95%, about 80%-95%, about 85%-95%, or about 90%-95%) of the aqueous etching composition. Without wishing to be bound by theory, it is believed that a strongly acidic environment is needed for the nitrate source and the halide source to form an oxidizing nitrosyl halide intermediate, which is an active ingredient in etching a NiPt film. However, although using a large amount of a nitrate source (e.g., nitric acid) or a halide source (e.g., hydrochloric acid) can provide sufficient acidity to the etching composition, they can overly oxidize the materials (e.g., NiPtSi) adjacent to the NiPt film, thereby damaging the adjacent features. Without wishing to be bound by theory, the inventors discovered that using a relative high amount (e.g., about 60%-95%) of a sulfonic acid and a relatively small amount (e.g., about 0.01%-0.5%) of a halide source and/or a relatively small amount (e.g., about 0.01%-20%) of a nitrate source can maintain the acidity of the etching composition to facilitate the etching of NiPt, while reducing the oxidation of NitPtSi during the etching process.

In some embodiments, the sulfonic acid is about 25%-60% (e.g., about 25-50% or about 30-45%) of the aqueous etching composition described herein.

In some embodiments, the halide anion is about 0.01% to about 0.5% of the aqueous etching composition described herein. In some embodiments, the halide anion is about 0.01% to about 0.3% of the aqueous etching composition. In some embodiments, the halide anion is about 0.01% to about 0.2% of the aqueous etching composition. In some embodiments, the halide anion is about 0.01% to about 0.1% of the aqueous etching composition. Without wishing to be bound theory, the inventors discovered that including about 0.01% to about 0.5% of a halide anion into the aqueous etching composition described herein can significantly reduce Al etching/corrosion and reduce NiPtSi oxidation when the etching composition is used to etch a NiPt film, while still effectively etching the NiPt film.

In some embodiments, the nitrate or nitrosyl ion is about 0.1% to about 20% of the aqueous etching composition described herein. In some embodiments, the nitrate or nitrosyl ion is about 0.5% to about 10% of the aqueous etching composition. In some embodiments, the nitrate or nitrosyl ion is about 0.5% to about 5% of the aqueous etching composition. In some embodiments, the nitrate or nitrosyl ion is about 0.5% to about 2.5% of the aqueous etching composition.

In some embodiments, the nitrate or nitrosyl ion is about 2.5% to about 7% (e.g., about 2.5% to about 6% or about 3% to about 5%) of the aqueous etching composition.

In some embodiments, the water is about 3% to about 60% of the aqueous etching composition described herein. In some embodiments, the water is about 3% to about 40% of the aqueous etching composition. In some embodiments, the water is about 14% to about 40% of the aqueous etching composition. In some embodiments, the water is about 20% to about 35% of the aqueous etching composition.

In some embodiments, the water is about 30% to about 60% (e.g., about 35% to about 50% or about 40% to about 45%) of the aqueous etching composition.

In some embodiments, the aqueous etching composition contains A) about 25% to about 95% (e.g., about 60% to about 95%, about 60% to about 90%, about 60% to about 80%, about 65% to about 95%, about 65% to about 90%, about 65% to about 80%, about 70% to about 95%, about 70% to about 90%, or about 70% to about 80%) of at least one sulfonic acid (e.g., methane sulfonic acid and/or p-toluene sulfonic acid), B) about 0.01% to about 0.5% (e.g., about 0.01% to about 0.3%, about 0.01% to about 0.2%, or about 0.01% to about 0.1%) of at least one halide anion selected from the group consisting of chloride and bromide (e.g., chloride), C) about 0.1% to about 20% (e.g., about 0.5% to about 10%, about 0.5% to about 5%, or about 0.5% to about 2.5%) of at least one nitrate anion or a nitrosyl cation (e.g., nitrate), D) corresponding counter ions for the halide and nitrate anions (or nitrosyl cation), and E) at least about 3% (e.g., about 3% to about 60%, about 3% to about 40%, about 14% to about 40%, or about 20 to about 35%) water.

In some embodiments, the aqueous etching composition contains A) about 60% to about 95% (e.g., about 60% to about 90%, about 60% to about 80%, about 65% to about 95%, about 65% to about 90%, about 65% to about 80%, about 70% to about 95%, about 70% to about 90%, or about 70% to about 80%) of at least one sulfonic acid (e.g., methane sulfonic acid and/or p-toluene sulfonic acid), B) about 0.01% to about 0.5% (e.g., about 0.01% to about 0.3%, about 0.01% to about 0.2%, or about 0.01% to about 0.1%) of at least one halide anion selected from the group consisting of chloride and bromide (e.g., chloride), C) about 0.1% to about 20% (e.g., about 0.5% to about 10%, about 0.5% to about 5%, or about 0.5% to about 2.5%) of at least one nitrate anion or a nitrosyl cation (e.g., nitrate), D) corresponding counter ions for the halide and nitrate anions (or nitrosyl cation), and E) about 3% to about 40% (e.g., about 14% to about 40% or about 20 to about 35%) water.

In some embodiments, the aqueous etching composition contains A) about 60% to about 90% (e.g., about 60% to about 80%, about 65% to about 95%, about 65% to about 90%, about 65% to about 80%, about 70% to about 95%, about 70% to about 90%, or about 70% to about 80%) of at least one sulfonic acid (e.g., methane sulfonic acid and/or p-toluene sulfonic acid), B) about 0.01% to about 0.3% (e.g., about 0.01% to about 0.2% or about 0.01% to about 0.1%) of at least one halide anion selected from the group consisting of chloride and bromide (e.g., chloride), C) about 0.5% to about 10% (e.g., about 0.5% to about 5% or about 0.5% to about 2.5%) of at least one nitrate anion or a nitrosyl cation (e.g., nitrate), D) corresponding counter ions for the halide and nitrate anions (or nitrosyl cation), and E) about 3% to about 40% (e.g., about 14% to about 40% or about 20 to about 35%) water.

In some embodiments, the aqueous etching composition contains A) about 65% to about 90% (e.g., about 65% to about 80%, about 70% to about 90%, or about 70% to about 80%) of at least one sulfonic acid (e.g., methane sulfonic acid and/or p-toluene sulfonic acid), B) about 0.01% to about 0.2% (e.g., about 0.01% to about 0.1%) of at least one halide anion selected from the group consisting of chloride and bromide (e.g., chloride), C) about 0.5% to about 5% (e.g., about 0.5% to about 2.5%) of at least one nitrate anion or a nitrosyl cation (e.g., nitrate), D) corresponding counter ions for the halide and nitrate anions (or nitrosyl cation), and E) about 14% to about 40% (e.g., about 20% to about 35%) water.

In some embodiments of the disclosure, an aqueous etching composition consists essentially of A) about 25% to about 95% (e.g., about 60% to about 95%, about 60% to about 90%, about 60% to about 80%, about 65% to about 95%, about 65% to about 90%, about 65% to about 80%, about 70% to about 95%, about 70% to about 90%, or about 70% to about 80%) of at least one sulfonic acid (e.g., methane sulfonic acid and/or p-toluene sulfonic acid), B) about 0.01% to about 0.5% (e.g., about 0.01% to about 0.3%, about 0.01% to about 0.2%, or about 0.01% to about 0.1%) of at least one halide anion selected from the group consisting of chloride and bromide (e.g., chloride), C) about 0.1% to about 20% (e.g., about 0.5% to about 10%, about 0.5% to about 5%, or about 0.5% to about 2.5%) of at least one nitrate anion or a nitrosyl cation (e.g., nitrate), D) corresponding counter ions for the halide and nitrate anions (or nitrosyl cation), and E) at least about 3% (e.g., about 3% to about 60%, about 3% to about 40%, about 14% to about 40%, or about 20 to about 35%) water. As used herein, the phrase "consisting essentially of" limits an etching composition to the specified materials A)-E) and the materials that do not materially affect the basic and novel characteristics of the composition, i.e., effectively etching a metal film (e.g., a NiPt film) without significantly etching/oxidizing an adjacent material (e.g., Al or NiPtSi). For example, the materials that do not materially affect the basic and novel characteristics of the composition can include an additive (e.g., solvents, carboxylic acids or other complexing agents, anti-corrosion agents, viscosity reducing agents, and surfactants).

In some embodiments, the aqueous etching composition consists essentially of A) about 60% to about 95% (e.g., about 60% to about 90%, about 60% to about 80%, about 65% to about 95%, about 65% to about 90%, about 65% to about 80%, about 70% to about 95%, about 70% to about 90%, or about 70% to about 80%) of at least one sulfonic acid (e.g., methane sulfonic acid and/or p-toluene sulfonic acid), B) about 0.01% to about 0.5% (e.g., about 0.01% to about 0.3%, about 0.01% to about 0.2%, or about 0.01% to about 0.1%) of at least one halide anion selected from the group consisting of chloride and bromide (e.g., chloride), C) about 0.1% to about 20% (e.g., about 0.5% to about 10%, about 0.5% to about 5%, or about 0.5% to about 2.5%) of at least one nitrate anion or a nitrosyl cation (e.g., nitrate), D) corresponding counter ions for the halide and nitrate anions (or nitrosyl cation), and E) about 3% to about 40% (e.g., about 14% to about 40% or about 20 to about 35%) water.

In some embodiments, the aqueous etching composition consists essentially of A) about 60% to about 90% (e.g., about 60% to about 80%, about 65% to about 95%, about 65% to about 90%, about 65% to about 80%, about 70% to about 95%, about 70% to about 90%, or about 70% to about 80%) of at least one sulfonic acid (e.g., methane sulfonic acid and/or p-toluene sulfonic acid), B) about 0.01% to about 0.3% (e.g., about 0.01% to about 0.2% or about 0.01% to about 0.1%) of at least one halide anion selected from the group consisting of chloride and bromide (e.g., chloride), C) about 0.5% to about 10% (e.g., about 0.5% to about 5% or about 0.5% to about 2.5%) of at least one nitrate anion or a nitrosyl cation (e.g., nitrate), D) corresponding counter ions for the halide and nitrate anions (or nitrosyl cation), and E) about 3% to about 40% (e.g., about 14% to about 40% or about 20 to about 35%) water.

In some embodiments, the aqueous etching composition consists essentially of A) about 65% to about 90% (e.g., about 65% to about 80%, about 70% to about 90%, or about 70% to about 80%) of at least one sulfonic acid (e.g., methane sulfonic acid and/or p-toluene sulfonic acid), B) about 0.01% to about 0.2% (e.g., about 0.01% to about 0.1%) of at least one halide anion selected from the group consisting of chloride and bromide (e.g., chloride), C) about 0.5% to about 5% (e.g., about 0.5% to about 2.5%) of at least one nitrate anion or a nitrosyl cation (e.g., nitrate), D) corresponding counter ions for the halide and nitrate anions (or nitrosyl cation), and E) about 14% to about 40% (e.g., about 20% to about 35%) water.

In some embodiments, the aqueous etching composition contains (or consists essentially of) A) about 25% to about 95% (e.g., about 60% to about 95%, about 60% to about 90%, about 60% to about 80%, about 65% to about 95%, about 65% to about 90%, about 65% to about 80%, about 70% to about 95%, about 70% to about 90%, or about 70% to about 80%) of methane sulfonic acid, B) about 0.01% to about 0.5% (e.g., about 0.01% to about 0.3%, about 0.01% to about 0.2%, or about 0.01% to about 0.1%) of chloride, C) about 0.1% to about 20% (e.g., about 0.5% to about 10%, about 0.5% to about 5%, or about 0.5% to about 2.5%) of nitrate, D) corresponding counter ions for the chloride and nitrate anions, and E) at least about 3% (e.g., about 3% to about 60%, about 3% to about 40%, about 14% to about 40%, or about 20 to about 35%) water.

In some embodiments, the aqueous etching composition contains (or consists essentially of) A) about 25% to about 95% (e.g., about 60% to about 95%, about 60% to about 90%, about 60% to about 80%, about 65% to about 95%, about 65% to about 90%, about 65% to about 80%, about 70% to about 95%, about 70% to about 90%, or about 70% to about 80%) of methane sulfonic acid and p-toluenesulfonic acid, B) about 0.01% to about 0.5% (e.g., about 0.01% to about 0.3%, about 0.01% to about 0.2%, or about 0.01% to about 0.1%) of chloride, C) about 0.1% to about 20% (e.g., about 0.5% to about 10%, about 0.5% to about 5%, or about 0.5% to about 2.5%) of nitrate, D) corresponding counter ions for the chloride and nitrate anions, and E) at least about 3% (e.g., about 3% to about 60%, about 3% to about 40%, about 14% to about 40%, or about 20 to about 35%) water.

The pH of the etching composition described herein ranges from about 2 to less than about 0. A preferred pH is from about 1.5 to less than about 0. A more preferred pH is from about 1 to less than about 0. The most preferred pH is less than about 0. In some embodiments, the pH is from about −2 to about 2. In some embodiments, the pH is from about −2 to about 0.

Optional additives may be employed in all embodiments to optimize performance or lower cost include solvents, carboxylic acids or other complexing agents, anti-corrosion agents, viscosity reducing agents and surfactants. The carboxylic acids can be used to improve the metal ion solubility by complimenting the chloride complexation. The surfactants can be used in their traditional purpose as surface tension modifiers but also as wetting agents to inhibit corrosion on various exposed surfaces such as aluminum, silicon dioxide, silicon nitride, silicide, tungsten, and TiN. The solvents allow modification of the Hansen solubility parameters for the solution to target some organic residue removal and change the oxidation potential of the solution. Additives employed may be mixtures of different types, mixtures of the same class of additive, or mixtures of both the same class and different types of additives. Care should be taken that the additives are stable under the low pH and oxidizing conditions.

In some embodiments, the etching composition described herein includes one or more organic solvents. In some embodiments, the organic solvents suitable for use in the etching compositions described herein exclude stabilizers such as glycols, ethers, and polyols. Examples of specific organic solvents (or stabilizer) that can be excluded from the etching composition include glyme, diglyme, triglyme, crown ethers, ethylene glycol, tripropylene glycol, and propylene glycol methyl ether. In some embodiments, the etching composition can include one or more the excluded solvents described above.

Concentration of the additives may depend on the effectiveness or purpose of the specific additive. The concentration of additional solvents that may be employed can be from about 3% to about 35%. The concentration of carboxylic acids, other chelating agents, viscosity reducing agents, and surfactants can be from about 0.001% to about 10%.

In some embodiments, the formulation is mixed and used immediately after use. In some embodiments, the formulation is mixed and stored for a period of time before use. In some embodiments, the components are divided between one or more of a Formulation A, a Formulation B, and optionally a Formulation C. Formulation A and B and optional Formulation C are mixed to produce an aqueous etching composition of this disclosure.

Thus, in some embodiments, this disclosure concerns a kit comprising, in two or optionally, three containers, the following reagents for forming an etching composition for microelectronic device manufacture: a) at least one sulfonic acid, b) at least one halide anion wherein the halide is selected from the group consisting of bromide and chloride, c) at least one nitrate anion or nitrosyl cation or mixtures thereof, d) corresponding counter ions for the halide and nitrate anions (or nitrosyl cation), and e) water with the proviso that the at least one nitrate anion or nitrosyl cation and the at least one halide anion are in different containers.

In some embodiments, this disclosure concerns a kit comprising, in two, or optionally three, containers, compositions that when mixed form an aqueous etching composition described herein for microelectronic device manufacture. Such an aqueous etching composition can include A) about 25% to about 95% (e.g., about 60% to about 95%) of at least one sulfonic acid, B) about 0.01% to about 0.5% (e.g., about 0.01% to about 0.3%, about 0.01% to about 0.2%, or about 0.01% to about 0.1%) of at least one halide anion selected from the group consisting of chloride and bromide, C) about 0.1%-20% (e.g., about 0.5%-10%, about 0.5%-5%, or about 0.5%-2.5%) of at least one nitrate anion or nitrosyl cation, D) corresponding counter ions for the nitrate and halide anions and nitrosyl cation, and E) at least about 3% water with the proviso that the at least one nitrate anion or nitrosyl cation and the at least one halide anion are in different containers.

In some embodiments, Formulation A contains the halide anion and sulfonic acid and optionally, water, and optional ingredients. Formulation B contains the nitrate or nitrosyl ion and sulfonic acid, and optionally water and optional ingredients. Concentrations of the components of Formulation A and Formulation B are adjusted to yield the concentration desired after mixing Formulations A and B. The specific concentrations will be dependent on the mixing ratio of Formulations A and B. A wide range of mixing ratios may be employed, but could be limited by the amounts of specific component required for the final formulation. A 1:1 mixing ratio is convenient and generally preferred.

For example, a 200 g sample of 90% sulfonic acid, 0.5% HCl, 2% $HNO_3$, and 7.5% water, can be obtained with a 1:1 mixing ratio with the following formulations A and B:
Formulation A: 1 g HCl, 9 g water, and 90 g sulfonic acid,
Formulation B: 4 g $HNO_3$, 6 g water, and 90 g sulfonic acid.

The water and sulfonic acid contents in the two formulations may be adjusted somewhat but the adjustment range is limited by the low amount of water and whether or not the $HNO_3$ and HCl are introduced as aqueous solutions.

The same 90% sulfonic acid, 0.5% HCl, 2% $HNO_3$, and 7.5% water formulation described above can be obtained using a 1:3 and a 3:1 mixing ratio as follows:

1:3 Ratio:
Formulation A: 1 g HCl, 8 g water, and 41 g sulfonic acid,
Formulation B: 4 g $HNO_3$, 7 g water, and 139 g sulfonic acid.

3:1 Ratio:
Formulation A: 1 g HCl, 8 g water, and 141 g sulfonic acid,
Formulation B: 4 g $HNO_3$, 7 g water, and 39 g sulfonic acid.

Alternatively, one of the formulations described in the preceding paragraph can contain only HCl and water. For example, the same 90% sulfonic acid, 0.5% HCl, 2% $HNO_3$, and 7.5% water formulation described above can be obtained via mixing Formulations A and B below:
Formulation A: 1 g HCl, and 8 g water
Formulation B: 4 g $HNO_3$, 7 g water, and 180 g sulfonic acid.

Those skilled in the art can easily calculate the amounts of each component necessary for Formulations A and B for each mixing ratio.

This disclosure additionally is concerned with a process for etching metal films. The metal films to be etched include the Noble metals (e.g., Pt, Au, Pd, Ir, Ni, Mo, Rh, and Re), Lanthanide metals (e.g., Erbium, Gadolinium, Ytterbium, Yttrium, Holmium, and Dysprosium), and alloys (e.g. NiPt (3-20%)) thereof.

Materials likely to be integrated into advanced integrated circuit design and exposed to the etching composition which are not desired to be etched include high-k materials (e.g., $HfO_2$, HfON, and HfSiON), Metal Gate Materials (e.g., TiN, TaN, TiAlN, and W), interstitial layers (e.g., $Al_2O_3$ and $La_2O_5$), fill metals (e.g., aluminum), dielectrics (e.g., $Si_3N_4$ and $SiO_2$), semiconductors (e.g., p-doped and n-doped Si, Ge, and SiGe), silicides of the metals to be etched (e.g. nickel platinum silicide), contact materials (e.g., NiGe, NiPtGe, and NiInSb), and III-V materials (e.g., InGaAs, InSb, GaP, GaAs, and InP). The etch compositions and processes of this disclosure should be optimized in order to cause minimal or no damage to these films but yet remove the undesired metal.

In some embodiments, the metal etching process described herein concerns the etching of nickel and/or nickel alloys (e.g., a nickel platinum alloy). In some embodiments, the process described herein concerns the etching of nickel platinum in the presence of Al films and/or nickel platinum silicide.

In some embodiments, the metal etching process described herein includes (a) providing a semiconductor substrate having a metal film partially or completely exposed to an etching composition of this disclosure and etchable by it; (b) contacting the metal film to be etched with an etching composition of this disclosure, and (c) rinsing the etched semiconductor substrate with a solvent (e.g., a solvent containing water).

The etching composition can be brought into contact with the semiconductor substrate by any suitable means known to those skilled in the art. Such means include, but are not limited to, immersing the semiconductor substrate in a bath of the etching composition, or spraying or streaming the etching composition onto the semiconductor substrate. The spraying or streaming of the etching composition can terminate once the substrate is covered with the etching composition, or can continue for a portion or all of the time the etching composition is in contact with the semiconductor substrate. Typically the semiconductor substrate and the etching composition can be brought fully into contact in a few seconds. Depending on the specific process, additional etchant may be applied during the etch period or consistently throughout the period.

During the etch period, the process can include or exclude means of agitation. For example, in an immersion embodiment of the process, the etch solution may be circulated or stirred. Alternatively, the substrate can be rotated or moved up and down during the etch. In streaming or spraying embodiments of the process where the semiconductor substrate is positioned horizontally, the substrate can be rotated horizontally. In any of the embodiments, the semiconductor substrate can be vibrated to induce agitation. Those skilled in the art can determine optimum combinations of contacting and agitation means for the specific application.

The etch period typically can run from approximately 30 seconds to about 30 minutes. The time will depend on the thickness of the film being etched, the necessity to avoid deleterious effects on other exposed films, the particular etch composition being employed, the specific contacting means being employed and the temperature employed.

The temperature at which the metal film is etched is typically between 25° C. and 60° C. A preferred temperature range is from about 25° C. to about 50° C. The most preferred temperature range is from about 30° C. to about 50° C. Alternatively, the temperature range can be from about 25° C. to about 80° C. or from about 30° C. to about 60° C.

Subsequent to the etching step, the semiconductor substrate is rinsed with solvent comprising water, preferably deionized water. Any suitable method of rinsing may be employed. Examples include immersion of the semiconductor substrate in stagnant or flowing water, or spraying or streaming water onto the semiconductor substrate. Agitation as described above during the etch period may be employed.

The aqueous based solvent may include additional aqueous soluble organic solvents. If employed the aqueous organic solvent will assist in removing organic residues or speed drying.

Subsequent to the rinsing step, in an optional step, the drying of the semiconductor substrate may be accelerated using a drying means. Examples of drying means include spraying with a non-oxidizing gas such as nitrogen gas, spinning the substrate, or baking on a hot plate or in an oven.

EXAMPLES

The present disclosure is illustrated in more detail with reference to the following examples, which are for illustrative purposes and should not be construed as limiting the scope of the present disclosure. Any percentages listed are by weight (wt %) unless otherwise specified. Controlled stirring during testing was done with a stir bar at 200 rpm unless otherwise noted.

General Procedure 1

Formulation Blending

Samples of etch/etchant compositions were prepared by adding, while stirring, to the calculated amount of ultra pure deionized water (DI water) at least one halide ion source (1), at least one sulfonic acid and at least one nitrate ion or nitrosyl source (2). After a uniform solution was achieved the optional additives (except optional pH adjusting agents), if used, were added. The solution was allowed to equilibrate and the pH of the etch/etchant composition was taken, if needed.

The pH measurements, if needed, were taken at ambient temperature after all components were fully dissolved. All components used were commercially available and of high purity.

General Procedure 2

Etch Test in Beaker

The NiPt patterned wafers, containing materials and features shown in FIG. 1, were diced into test coupons containing these key features for the etch tests. In FIG. 1, WFM is Work Function Metal; PMOS p-type Silicide on Silicon; and NMOS is n-type Silicide on Silicon.

Typically, on the top of NiPt layer, there can be a TiN cap (not shown in Figure) with thickness of around 50-100Å which can be removed by standard SC1 solution (1:1:5 part in volume 29% $NH_4OH$:30% $H_2O_2$:$H_2O$) at room temperature for around 10 min prior to etch test. The test coupons were held using 4" long plastic locking tweezers, whereby the coupon could then be suspended into a 500 ml volume glass beaker containing approximately 200 ml's of the etch compositions of the present disclosure. Prior to immersion of the coupon into the etch composition, the composition was preheated to the test condition temperature of 30° C.-80° C. with controlled stirring. The etch tests were then carried out by placing the coupon which was held by the plastic tweezers into the heated composition in such a way that the NiPt layer containing side of the coupon faced the stir bar. The coupon was left static in the etch composition for a period of 1 or 2 or 5 minutes while the composition was kept at the test temperature under controlled stirring. Once the coupon was exposed in the composition for the duration of the test, the coupon was quickly removed from the etch composition and placed in a 500 ml plastic beaker filled with approximately 400 ml of DI water at ambient temperature (~17° C.) with gentle stirring. The coupon was left in the beaker of DI water for approximately 30 seconds, and then quickly removed, and rinsed under a DI water stream at ambient temperature for about 30 seconds. Then the coupon was immediately exposed to a nitrogen gas stream from a hand held nitrogen blowing gun which caused any droplets on the coupon surface to be blown off the coupon, and further to completely dry the coupon device surface. Following this final nitrogen drying step, the coupon was removed from the plastic tweezers holder and placed into a covered plastic carrier with the device side up for short term storage no greater than about 2 hours. The scanning electron microscopy (SEM) images were then collected for key features on the cleaned test coupon device surface.

General Procedure 3

Materials Compatibility Test in Beaker

The blanket TiN on 5000 Å silicon oxide on silicon substrate, NiPtSi on silicon substrate, and pure Al metal on 5000 Å $SiO_2$ on silicon substrate, NiPtSiC on silicon substrate, NiPtSiGe on silicon substrate, TaN on silicon substrate, $HfO_2$ on silicon substrate, $SiO_2$ on silicon substrate, SiN on silicon substrate, and W on 1000 Å silicon oxide on silicon substrate wafers were diced into approximately 1 inch×1 inch square test coupons for the materials compatibility tests. The test coupons were initially measured for thickness or sheet resistance by the 4-point probe, CDE Resmap 273 for metallic film, or by Elipsometry for dielectric film using a Woollam M-2000X. The test coupons were then held using 4" long plastic locking tweezers, whereby the coupon could then be suspended into a 500 ml volume glass beaker containing approximately 200 ml of the etch compositions of the present disclosure. Due to the reactive nature of the compositions, they may also be formulated into two components that would be mixed together and then heated at point of use (or heated and then mixed with optional heating at point of use) to give the final etching composition. This type of partitioning of the composition is done to separate the reactive chloride and nitrate components to improve shelf and storage life of the etching solutions.

Prior to immersion of the coupon into the etch composition, the composition was pre-heated to the test condition temperature of 30° C.-80° C. with controlled stirring. The materials compatibility tests were then carried out by placing the coupon which was held by the plastic tweezers into the heated composition in such a way that the TiN, NiPtSi, NiPtSiC, NiPtSiGe, TaN, $HfO_2$, $SiO_2$, SiN, W or pure Al layer containing side of the coupon faced the stir bar. The coupon was left static in the etch composition for a period of 1 or 2 or 5 or 10 or 30 or 60 minutes while the composition was kept at the test temperature under controlled stirring. Once the coupon was exposed in the composition for the duration of the test, the coupon was quickly removed from the etch composition and placed in a 500 ml plastic beaker filled with approximately 400 ml of DI water at ambient temperature (~17° C.) with gentle stirring. The coupon was left in the beaker of DI water for approximately 30 seconds, and then quickly removed, and rinsed under a DI water stream at ambient temperature for about 30 seconds. Then the coupon was immediately exposed to a nitrogen gas stream from a hand held nitrogen blowing gun which caused any droplets on the coupon surface to be blown off the coupon, and further to completely dry the coupon surface. Following this final nitrogen drying step, the coupon was removed from the plastic tweezers holder and placed into a covered plastic carrier with the TiN, NiPtSi and pure Al side up for short term storage no greater than about 2 hours. The post-thickness or sheet resistance was then collected on the post-processing test coupon surface by the 4-point probe, CDE Resmap 273 or by Elipsometry for dielectric film using a Woollam M-2000X.

General Procedure 4

Oxidation Analysis

The oxidation and cleaning of the substrates were evaluated using Electron Spectroscopy for Chemical Analysis (ESCA) and a SEM Pad. The profile of the degree of oxidation of the NiPt silicide was measured by ESCA using Ar ion etching at a rate of approximately 10 angstroms/second on a wide area down through the top 130 angstroms of the film. The SEM pad, a 60×100 μm rectangular structure on the die that contained residual NiPt on metal rich $Ni_xPt_ySi_z$ was used to evaluate the cleaning of the residual NiPt and oxidation of the underlying metal rich silicides.

Formulation Examples and Formulation Examples

CFE1-CFE45

TABLE 1

Etching Compositions

| Formulation # | Acid Halide compound/ Amount [g] | Nitric Acid/ Amount [g] | Other Halide Source/ Amount [g] | Other Nitrate source/ Amount [g] | Sulfonic Acid/ Amount [g] | Water/other Added [g] | Total Water in all sources (g) |
|---|---|---|---|---|---|---|---|
| FE6 | HCl 2.7 | $HNO_3$ 14.29 | | | MSA 183.01 | | 60.89 |
| FE7 | HCl 1.08 | $HNO_3$ 1.43 | | | MSA 197.49 | | 60.36 |
| FE8 | HCl 1.08 | $HNO_3$ 7.15 | | | MSA 191.77 | | 60.36 |
| FE11 | HCl 1.08 | $HNO_3$ 7.15 | | | MSA 168.91 | 22.86 Water | 76.35 |
| FE12 | HCl 1.08 | $HNO_3$ 7.15 | | | MSA 138.45 + 53.32 MSA (100%) | | 44.36 |
| FE13 | HCl 1.08 | $HNO_3$ 7.15 | | | MSA 85.11 + 106.66 MSA (100%) | | 28.36 |

TABLE 1-continued

Etching Compositions

| Formulation # | Acid Halide compound/ Amount [g] | Nitric Acid/ Amount [g] | Other Halide Source/ Amount [g] | Other Nitrate source/ Amount [g] | Sulfonic Acid/ Amount [g] | Water/other Added [g] | Total Water in all sources (g) |
|---|---|---|---|---|---|---|---|
| FE14 | HCl 1.08 | HNO$_3$ 7.15 | | | MSA 31.78 + 159.99 MSA (100%) | | 12.36 |
| FE15 | HCl 1.08 | HNO$_3$ 28.57 | | | MSA 170.347 | | 60.36 |
| FE16 | HCl 1.08 | HNO$_3$ 57.143 | | | MSA 141.776 | | 60.36 |
| FE17 | HCl 0.541 | HNO$_3$ 7.143 | | | MSA 192.317 | | 60.18 |
| FE18 | HCl 0.27 | HNO$_3$ 7.143 | | | MSA 192.587 | | 60.09 |
| FE19 | HCl 0.27 | HNO$_3$ 28.571 | | | MSA 171.158 | | 60.09 |
| FE21 | HCl 0.162 | HNO$_3$ 7.143 | | | MSA 192.695 | | 60.06 |
| FE22 | HCl 0.054 | HNO$_3$ 7.143 | | | MSA 192.803 | | 60.02 |
| FE23 | HBr 1.847 | HNO$_3$ 7.143 | | | MSA 191.01 | | 60.41 |
| FE26 | HCl 0.27 | HNO$_3$ 7.143 | | | MSA 177.46 PTSA 15.13 | | 60.67 |
| FE27 | HCl 0.27 | HNO$_3$ 7.143 | | | MSA 186.536 PTSA 6.051 | | 60.325 |
| FE28 | HCl 0.27 | HNO$_3$ 7.143 | | | MSA 189.56 PTSA 3.026 | | 60.21 |
| FE29 | HCl 0.27 | HNO$_3$ 7.143 | | | MSA 190.587 OSBA 2 | | 59.49 |
| FE30 | HCl 0.27 | HNO$_3$ 7.143 | | | MSA 178.9; MSA(100%) 6 OSBA 14 | | 55.98 |
| FE31 | HCl 0.27 | HNO$_3$ 7.143 | | | MSA 191.59 TFMSA 1 | | 59.79 |
| FE32 | HCl 0.27 | HNO$_3$ 7.143 | | | MSA 169.587 TFMSA 16 | 7.00 Water | 60.185 |
| FE33 | HCl 0.27 | HNO$_3$ 7.143 | | | MSA 178.59 BSA 14 | | 57.69 |
| FE34 | | HNO$_3$ 7.143 | TMACl 0.3 | | MSA 186.06 PTSA 6.051 | 0.446 Water | 60.40 |
| FE35 | | HNO$_3$ 7.143 | NH4Cl 0.16 | | MSA 186.7 PTSA 6.051 | | 60.19 |
| FE36 | HCl 0.27 | HNO$_3$ 28.57 | | | MSA 149.0 | 22.16 water | 75.6 |
| FE37 | HCl 0.27 | HNO3 7.143 | | | MSA 59.18 MSA (100%) 23.4 NAP 10 | | 52.06 |
| CFE1 | HCl 21.62 | HNO$_3$ 5.71 | none | none | none | 172.67 water | 188.00 |
| CFE2 | HCl 21.62 | HNO$_3$ 20.01 | none | none | none | 158.37 water | 178.00 |
| CFE3 | HCl 21.62 | HNO$_3$ 34.29 | none | none | none | 144.09 water | 168.00 |
| CFE4 | HCl 59.46 | HNO$_3$ 5.71 | none | none | none | 134.83 water | 174.00 |
| CFE5 | HCl 59.46 | HNO$_3$ 20.01 | none | none | none | 120.53 water | 164.00 |
| CFE6 | HCl 59.46 | HNO$_3$ 34.29 | none | none | none | 106.25 water | 154.00 |
| CFE7 | HCl 97.30 | HNO$_3$ 5.71 | none | none | none | 96.99 water | 160.00 |
| CFE8 | HCl 97.30 | HNO$_3$ 20.01 | none | none | none | 82.70 water | 150.00 |
| CFE9 | HCl 97.30 | HNO$_3$ 34.29 | none | none | none | 68.41 water | 140.00 |
| CFE10 | HCl 40.54 | HNO$_3$ 12.86 | none | none | none | 146.60 water | 176.00 |
| CFE11 | HCl 40.54 | HNO$_3$ 27.14 | none | none | none | 132.32 water | 166.00 |
| CFE12 | HCl 78.38 | HNO$_3$ 12.86 | none | none | none | 108.76 water | 162.00 |
| CFE13 | HCl 78.38 | HNO$_3$ 27.14 | none | none | none | 94.48 water | 152.00 |
| CFE14 | HCl 21.62 | HNO$_3$ 20.01 | TMACl 42.09 | none | none | 116.28 water | 135.90 |
| CFE15 | HCl 21.62 | HNO$_3$ 20.01 | TMACl 84.17 | none | none | 74.21 water | 93.83 |
| CFE16 | HCl 1.08 | HNO$_3$ 7.15 | none | none | none | 191.77 water | 194.60 |
| CFE17 | HCl 1.08 | HNO$_3$ 198.919 | none | none | none | | 60.36 |
| CFE18 | none | HNO$_3$ 20.01 | none | none | MSA 94.95 | 85.05 water | 119.54 |
| CFE19 | HCl 21.62 | none | none | none | MSA 104.34 | 74.04 water | 118.96 |
| CFE20 | HCl 21.62 | HNO$_3$ 20.01 | none | none | MSA 36.90 | 121.47 Water | 152.16 |
| CFE21 | HCl 21.62 | HNO$_3$ 20.01 | none | none | MSA 73.80 | 84.57 Water | 126.33 |
| CFE22 | HCl 21.62 | HNO$_3$ 20.01 | none | none | MSA 55.35 | 103.02 Water | 139.24 |
| CFE23 | HCl 16.21 | HNO$_3$ 20.01 | none | none | MSA 69.86 | 93.91 Water | 131.08 |
| CFE24 | HCl 21.62 | HNO$_3$ 14.29 | none | none | MSA 82.65 | 81.45 water | 124.15 |
| CFE25 | HCl 21.62 | HNO$_3$ 14.29 | none | none | MSA 73.80 | 90.29 Water | 130.33 |
| CFE26 | HCl 21.62 | HNO$_3$ 7.14 | none | none | MSA 93.35 | 77.88 Water | 121.65 |
| CFE27 | HCl 21.62 | HNO$_3$ 7.14 | none | none | MSA 73.80 | 97.44 water | 135.34 |
| CFE28 | HCl 21.62 | HNO$_3$ 20.01 | TMACl 42.08 | none | MSA 36.90 | 79.39 Water | 110.08 |
| CFE29 | HCl 21.62 | HNO$_3$ 20.01 | none | none | MSA 158.38 | | 67.14 |
| CFE30 | HCl 10.81 | HNO$_3$ 20.01 | none | none | MSA 84.38 | 84.81 water | 122.93 |
| CFE31 | HCl 10.81 | HNO$_3$ 20.01 | none | none | MSA 65.92 | 103.26 Water | 135.85 |
| CFE32 | HCl 10.81 | HNO$_3$ 14.29 | none | none | MSA 97.75 | 77.16 water | 117.58 |
| CFE33 | none | none | TMACl 12.06 | TMANO$_3$ 15.11 | MSA 134.29 | 38.56 Water | 78.85 |

TABLE 1-continued

Etching Compositions

| Formulation # | Acid Halide compound/ Amount [g] | Nitric Acid/ Amount [g] | Other Halide Source/ Amount [g] | Other Nitrate source/ Amount [g] | Sulfonic Acid/ Amount [g] | Water/other Added [g] | Total Water in all sources (g) |
|---|---|---|---|---|---|---|---|
| CFE34 | HCl 10.81 | HNO$_3$ 14.29 | | | MSA 174.9 | | 63.57 |
| CFE35 | HCl 10.81 | HNO$_3$ 1.43 | | | MSA 187.76 | | 63.57 |
| CFE36 | | HNO$_3$ 7.15 | TMACl 1.20 | | MSA (100%) 191.65 | | 2.145 |
| CFE37 | HCl 1.08 | HNO$_3$ 142.857 | | | MSA 56.062 | | 60.36 |
| CFE38 | HBr 9.235 | HNO$_3$ 7.143 | | | MSA 183.622 | | 62.03 |
| CFE39 | 1.08 HCl; 1.846 HBr | HNO$_3$ 7.143 | | | MSA 189.93 | | 60.76 |
| CFE40 | HCl 108.11 | HNO$_3$ 24.57 | none | none | none | 67.32 water | 142.8 |
| CFE41 | HCl 0.27 | HNO$_3$ 7.143 | none | none | none | 192.59 water | 194.90 |
| CFE42 | none | HNO$_3$ 28.57 | TMACl 4.40 | none | MSA 142.86 | 24.17 water | 75.60 |
| CFE43 | none | HNO$_3$ 7.143 | TMACl 4.40 | none | MSA 180.4 PTSA 6.051 | 2.06 water | 60.32 |
| CFE44 | none | HNO$_3$ 42.86 | Methylamine Hydrochloride 80.0 | none | none | 73.14 water 4.0 tetra-ethylene glycol dimethyl ether | 86 |
| CFE45 | HCl 5.41 | HNO$_3$ 14.29 | none | none | MSA 157.14 | 13.16 water 10 tetra-ethylene glycol dimethyl ether | 68 |

Notes:
Hydrochloric acid (HCl) is a 37% hydrochloric acid solution; Hydrobromic Acid (HBr) is a 48% acid solution; Methylamine Hydrochloride is a >98% solid; Nitric acid (HNO$_3$) is a 70% nitric acid solution; MSA is methanesulfonic acid which is a 70% methanesulfonic acid solution unless otherwise noted; PTSA is a 67% p-toluenesulfonic acid aqueous solution; BSA is a benzenesulfonic acid monohydrate solid; OSBA is an o-sulfonate benzoic acid solid dried under heat and vacuum to remove any water; TFMSA is a neat liquid containing trifluormethanesulfonic acid; NAP is 1,5-naphthalenedisulfonic acid tetrahydrate; TMACl is a tetramethylammonium chloride anhydrous solid; TMANO$_3$ is a tetramethylammonium nitrate anhydrous solid. The amount for each component in this table refers to the amount of the component as added to the composition, not the amount of the active ingredient in the component. For example, 2.7 g of HCl in FE6 refers to 2.7 g of a 37% hydrochloric acid solution, not 2.7 g of pure HCl.

Examples C1-C16

NiPt etch responses were measured on patterned substrates containing dense RPG (replacement gate) gate line arrays with exposed TiN, Al, SiON, SiO$_2$, and NiPtSi layers as shown in FIG. 1. These dense RPG gate line arrays were covered by NiPt layer with thickness of 100-350 Å. The substrates may or may not have been exposed to rapid thermal annealing (RTA) process prior to etch. NiPt etch tests were performed as outlined in General Procedure 2. Aluminum corrosion responses were measured on commercial pure Al blanket wafer. Aluminum corrosion tests were performed as outlined in General Procedure 3. Substrate chips were immersed into the etch compositions heated to 50° C. for 1 or 2 minutes for NiPt etch tests and for 1 or 2 or 5 or 10 minutes for Al corrosion tests. Etch efficiency was gauged by the amount of NiPt residues left on top of dense gate line arrays and aluminum corrosion by the etch rate of aluminum and the severity of pitting on aluminum surface. Results are given in Table 2.

TABLE 2

NiPt Etch and Al Corrosion Results for Formulations CFE1-CFE13, CFE 16, CFE17, and CFE41

| Example # | Formulation # | Calculated pH | NiPt Etch (1 to 10) | Al Corrosion and pitting (1 to 10) |
|---|---|---|---|---|
| C1 | CFE1 | −0.15 | 1 | 10 |
| C2 | CFE2 | −0.35 | 1 | 9 |
| C3 | CFE3 | −0.48 | 5 | 7 |
| C4 | CFE4 | −0.53 | 4 | 8 |
| C5 | CFE5 | −0.62 | 9 | 6 |
| C6 | CFE6 | −0.70 | 10 | 2 |
| C7 | CFE7 | −0.72 | 10 | 3 |
| C8 | CFE8 | −0.79 | 10 | 1 |
| C9 | CFE9 | −0.84 | 10 | 1 |
| C10 | CFE10 | −0.45 | 3 | 9 |
| C11 | CFE11 | −0.56 | 9 | 6 |
| C12 | CFE12 | −0.68 | 10 | 3 |
| C13 | CFE13 | −0.74 | 10 | 2 |
| C14 | CFE16 | 0.34 | 2 | 9 |
| C15 | CFE17 | −1.05 | 10 | 1 |
| C16 | CFE41 | 0.38 | 1 | 10 |

Note to NiPt etch rating: 1 = no NiPt removed; 10 = all of the NiPt was removed
Note to Al corrosion and pitting rating: 1 = Al layer was completely removed or High Al ER or Severe Al pitting; 10 = Low Al ER and no Al pitting As shown in Table 2, the formulations CFE1-CFE13, CFE16, CFE 17, and CFE41 could not achieve an adequate NiPt etch rate and yet have minimal aluminum corrosion.

Examples C17-27 and Examples 1-8

Evaluation of Corrosion Inhibitor and Etch Agent

Various materials were screened for their ability to inhibit Al corrosion in etch compositions of this disclosure, especially sulfonic acids. The substrate tested for aluminum corrosion is commercial pure Al blanket wafer. Sample coupons were treated as described in General Procedure 2 and 3. All NiPt etch tests were carried out @ 50° C. with 2 minutes immersion time and all aluminum corrosion tests were carried out @ 50° C. with 5 or 10 minutes immersion time. The aluminum coupon surfaces were examined for blanket etch rate and signs of pitting. Results are listed in Table 3.

TABLE 3

NiPt Etch and Al Corrosion Results for Formulations

| Example # | Formulation # | Sulfonic Acid/Amount[g] | Total H$^+$ Amount [moles] | Total Cl$^-$ Amount [moles] | Total NO$_3^-$ Amount [moles] | Total Water Moles | NiPt Etch (1 to 10) | Al Corrosion (1 to 10) | Al Pitting (1 to 10) |
|---|---|---|---|---|---|---|---|---|---|
| C17 | CFE2 | none | 0.441 | 0.219 | 0.222 | 9.89 | 1 | 4 | 10 |
| C18 | CFE16 | none | 0.090 | 0.011 | 0.0794 | 10.811 | 2 | 9 | 10 |
| C19 | CFE17 | none | 2.22 | 0.011 | 2.21 | 3.35 | 10 | 1 | 9.5 |
| C20 | CFE20 | MSA 36.90 | 0.710 | 0.219 | 0.222 | 8.46 | 6 | 5 | 8 |
| C21 | CFE21 | MSA 73.80 | 0.979 | 0.219 | 0.222 | 7.02 | 10 | 7 | 9 |
| C22 | CFE22 | MSA 55.35 | 0.845 | 0.219 | 0.222 | 7.73 | 8 | 4 | 8 |
| C23 | CFE41 | none | 0.0821 | 0.0027 | 0.0794 | 10.83 | 1 | 10 | 10 |
| C24 | CFE42 | MSA 142.86 | 1.399 | 0.0402 | 0.3175 | 4.2 | 10 | 3 | 5 |
| C25 | CFE43 | MSA 180.4 PTSA 6.051 | 1.418 | 0.0402 | 0.0794 | 3.35 | N/A | 2 | 2 |
| C26 | CFE44 | none | 0.476 | 1.186 | 0.476 | 4.78 | 4 | 1 | 1 |
| C27 | CFE45 | MSA 157.14 | 1.360 | 0.0549 | 0.159 | 3.78 | N/A | 3 | 4 |
| 1 | FE7 | MSA 197.49 | 1.47 | 0.011 | 0.0158 | 3.35 | 10 | 9.5 | 8 |
| 2 | FE8 | MSA 191.77 | 1.49 | 0.011 | 0.0794 | 3.35 | 10 | 9 | 10 |
| 3 | FE16 | MSA 141.78 | 1.68 | 0.011 | 0.635 | 3.35 | 10 | 7.5 | 9.5 |
| 4 | FE18 | MSA 192.59 | 1.486 | 0.0028 | 0.0794 | 3.34 | 9.5 | 9 | 10 |
| 5 | FE27 | MSA 186.54; PTSA 6.051 | 1.464 | 0.0028 | 0.0794 | 3.35 | 9.5 | 10 | 10 |
| 6 | FE34 | MSA 186.06 PTSA 6.051 | 1.460 | 0.00275 | 0.0794 | 3.36 | 9.5 | 10 | 10 |
| 7 | FE35 | MSA 186.7 PTSA 6.051 | 1.465 | 0.00299 | 0.0794 | 3.34 | 9.5 | 10 | 10 |
| 8 | FE-36 | MSA 149.0 | 1.407 | 0.0027 | 0.3174 | 4.20 | N/A | 6 | 8 |

Note to NiPt etch rating: 1 = no NiPt removed; 10 = all of the NiPt was removed
Note to Al corrosion rating: 1 = Al layer was completely removed or High Al ER; 10 = Low Al ER
Note to Al pitting rating: 1 = Severe Al pitting; 10 = No Al pitting
Note:
Acidity contribution calculation for H$^+$ for strong acids only (i.e. inorganic acid (1), inorganic acid (2), and MSA) assuming full ionization

Examples 9-17 and Examples C28-C43

Aluminum corrosion and NiPt etch responses were measured on the same type of substrates used in the earlier Examples. NiPt etch tests and aluminum corrosion tests were performed as outlined in General Procedure 2 and 3. Substrate coupons were immersed into the etch compositions heated to 50° C. for 1 or 2 minutes for NiPt etch tests and for 5 minutes for Al corrosion tests. Etch efficiency was gauged by the amount of NiPt residues left on top of dense gate line arrays and aluminum corrosion by the etch rate of aluminum and the severity of pitting on aluminum surface. Results are given in Table 4.

TABLE 4

NiPt Etch and Al Corrosion Responses at varying Cl$^-$, NO$_3^-$, H$^+$, Water and Halide source concentrations

| Example # | Formulation # | Total H$^+$ Amount [moles] | Total Cl$^-$ or Br$^-$ Amount [moles] | Total NO$_3^-$ Amount [moles] | Total Water Moles | NiPt Etch (1 to 10) | Al Corrosion and Pitting (1 to 10) |
|---|---|---|---|---|---|---|---|
| C28 | CFE14 | 0.441 | 0.603 | 0.222 | 7.55 | 3 | 7 |
| C29 | CFE15 | 0.441 | 0.988 | 0.222 | 5.21 | 3 | 6 |
| C30 | CFE16 | 0.090 | 0.011 | 0.0794 | 10.811 | 2 | 9 |
| C31 | CFE17 | 2.22 | 0.011 | 2.21 | 3.35 | 10 | 1 |
| C32 | CFE18 | 0.914 | 0.000 | 0.222 | 6.64 | 1 | 10 |
| C33 | CFE19 | 0.979 | 0.219 | 0.000 | 6.61 | 1.5 | 9 |
| C34 | CFE21 | 0.979 | 0.219 | 0.222 | 7.02 | 10 | 8 |
| C35 | CFE22 | 0.845 | 0.219 | 0.222 | 7.73 | 8 | 6 |
| C36 | CFE24 | 0.980 | 0.219 | 0.159 | 6.90 | 10 | 7 |
| C37 | CFE26 | 0.979 | 0.219 | 0.079 | 6.76 | 10 | 8 |
| C38 | CFE28 | 0.710 | 0.603 | 0.222 | 6.12 | 9.5 | 6 |
| C39 | CFE29 | 1.595 | 0.219 | 0.222 | 3.73 | 10 | 7.5 |
| C40 | CFE30 | 0.947 | 0.110 | 0.222 | 6.83 | 9.5 | 7 |
| C41 | CFE31 | 0.813 | 0.110 | 0.222 | 7.55 | 5 | 9 |
| C42 | CFE33 | 0.978 | 0.110 | 0.111 | 4.38 | 9 | 6 |
| C43 | CFE41 | 0.0821 | 0.0027 | 0.0794 | 10.83 | 1 | 10 |
| 9 | FE7 | 1.47 | 0.011 | 0.0158 | 3.35 | 10 | 9.5 |
| 10 | FE8 | 1.49 | 0.011 | 0.0794 | 3.35 | 10 | 9 |
| 11 | FE11 | 1.32 | 0.011 | 0.0795 | 4.24 | 10 | 6 |
| 12 | FE12 | 1.66 | 0.011 | 0.0795 | 2.46 | 10 | 10 |
| 13 | FE14 | 1.99 | 0.011 | 0.0795 | 0.687 | 8.5 | 10 |
| 14 | FE16 | 1.68 | 0.011 | 0.635 | 3.35 | 10 | 8.5 |
| 15 | FE17 | 1.49 | 0.0055 | 0.0795 | 3.34 | 10 | 9.5 |

TABLE 4-continued

NiPt Etch and Al Corrosion Responses at varying Cl⁻, $NO_3^-$, $H^+$, Water and Halide source concentrations

| Example # | Formulation # | Total $H^+$ Amount [moles] | Total Cl⁻ or Br⁻ Amount [moles] | Total $NO_3^-$ Amount [moles] | Total Water Moles | NiPt Etch (1 to 10) | Al Corrosion and Pitting (1 to 10) |
|---|---|---|---|---|---|---|---|
| 16 | FE18 | 1.49 | 0.0028 | 0.0795 | 3.34 | 9.5 | 9.5 |
| 17 | FE19 | 1.57 | 0.0028 | 0.317 | 3.34 | 10 | 9 |

Note to NiPt etch rating: 1 = no NiPt removed; 10 = all of the NiPt was removed
Note to Al corrosion and pitting rating: 1 = Al layer was completely removed or High Al ER or Severe Al pitting; 10 = Low Al ER and no Al pitting
Note:
Acidity contribution calculation for $H^+$ for contribution of all strong acids assuming full ionization The comparative formulations in Tables 3 and 4, including a few prior art compositions, contain a variety of chloride and nitrate sources in a range of concentrations and solvent. None of the comparative formulation in Tables 3 and 4 simultaneously achieved a high NiPt etch rate (defined by a rating of at least 8.5) and a high aluminum compatibility (defined as a rating of at least 8.5 in aluminum corrosion and pitting). (For Table 3 compositions, the Al compatibility rating is the average of the corrosion and pitting ratings.) Surprisingly, the compositions in Examples 1-7, 9, 10, and 12-17 containing a low level of chloride level (i.e., lower than 0.5% of chloride), a low to medium level of nitrate, at least one sulfonic acid, and water met these difficult, balanced criteria. In addition, as shown in Examples 4 and 5, inclusion of a second sulfonic acid having higher hydrophobicity (i.e., PTSA) than the first sulfonic acid (i.e. MSA) improved aluminum compatibility.

Examples 18-49 and Examples C44-C70

Evaluation of Etching Formulations for NiPt Etch, Al Compatibility and NiPtSi Oxidization In order to better understand the effect of main components of etch compositions of this disclosure on NiPt etch and aluminum corrosion and NiPtSi oxidization, the main component concentrations were varied and evaluated. NiPt etch and aluminum corrosion were measured on the same type of substrates used in the earlier Examples C1-43 and Examples 1-17. NiPtSi oxidization responses were measured on the substrates containing ~22 nm NiPtSi on silicon substrate and were either undoped (Table 5A), or n- or p-doped (Table 5B).

NiPt etch tests and aluminum corrosion and NiPtSi oxidization tests were performed as outlined in General Procedures 2, and 3 and the results were analyzed as described below and in General Procedure 4. Substrate coupons were immersed into the etch compositions heated to 50° C. for NiPt etch and aluminum corrosion tests for 2 and 5 minutes separately and then heated to 80° C. for NiPtSi oxidization tests for 30 minutes. Etch efficiency was gauged by the amount of NiPt residues left on top of dense gate line arrays and aluminum corrosion by the etch rate of aluminum and the severity of aluminum surface pitting and NiPtSi oxidization by the extent of sheet resistance change on processed NiPtSi substrates. Results are given in Tables 5A and 5B.

TABLE 5A

Ratings for Etchant Formulations in NiPt Etch, Aluminum Compatibility and (Undoped) NiPtSi Oxidation

| Example # | Formulation # | Total $H^+$ Amount [moles] | Total Cl⁻ or Br– Amount [moles] | Total $NO_3^-$ Amount [moles] | Total Water Amount [moles] | NiPt Etch (1 to 10) | Al Corrosion and Pitting (1 to 10) | NiPtSi (undoped) Oxidization (1 to 10) | | |
|---|---|---|---|---|---|---|---|---|---|---|
| | | | | | | | | blanket ΔRs | SEM-pad | ESCA - o profile |
| C44 | CFE18 | 0.914 | 0.000 | 0.222 | 6.64 | 1 | 10 | 7.5 | N/A | N/A |
| C45 | CFE19 | 0.979 | 0.219 | 0.000 | 6.61 | 1.5 | 9 | 7.5 | N/A | N/A |
| C46 | CFE21 | 0.979 | 0.219 | 0.222 | 7.02 | 10 | 8 | 3 | 1 | 1 |
| C47 | CFE22 | 0.846 | 0.219 | 0.222 | 7.73 | 8 | 5 | 5 | N/A | N/A |
| C48 | CFE23 | 0.896 | 0.166 | 0.222 | 7.28 | 9 | 3 | 5 | N/A | N/A |
| C49 | CFE24 | 0.980 | 0.219 | 0.159 | 6.90 | 10 | 7 | 3.5 | N/A | N/A |
| C50 | CFE25 | 0.916 | 0.219 | 0.159 | 7.24 | 9.5 | 7 | 3 | N/A | N/A |
| C51 | CFE26 | 0.980 | 0.219 | 0.080 | 6.76 | 10 | 8 | 3 | N/A | N/A |
| C52 | CFE27 | 0.838 | 0.219 | 0.080 | 7.52 | 5 | 7 | 3.5 | N/A | N/A |
| C53 | CFE29 | 1.595 | 0.219 | 0.222 | 3.73 | 10 | 7.5 | 6.5 | N/A | N/A |
| C54 | CFE30 | 0.947 | 0.110 | 0.222 | 6.83 | 9.5 | 7 | 5 | N/A | N/A |
| C55 | CFE31 | 0.813 | 0.110 | 0.222 | 7.55 | 4 | 9 | 5 | N/A | N/A |
| C56 | CFE32 | 0.980 | 0.110 | 0.158 | 6.53 | 10 | 8.5 | 5.5 | N/A | N/A |
| C57 | CFE33 | 0.978 | 0.110 | 0.111 | 4.38 | 9 | 6 | 6.5 | N/A | N/A |
| C58 | CFE34 | 1.54 | 0.110 | 0.159 | 3.53 | 10 | 8 | 5.5 | 5 | N/A |
| C59 | CFE35 | 1.49 | 0.110 | 0.0159 | 3.53 | 10 | N/A | 5 | N/A | N/A |
| C60 | CFE36 | 2.074 | 0.011 | 0.0795 | 0.119 | 3 | N/A | 10 | N/A | N/A |
| C61 | CFE37 | 2.01 | 0.011 | 1.5865 | 3.35 | 10 | 5.5 | 8 | 4 | N/A |
| C62 | CFE38 | 1.47 | 0.0548 (Br⁻) | 0.0795 | 3.45 | 9 | 4 | 9.5 | N/A | 7 |

TABLE 5A-continued

Ratings for Etchant Formulations in NiPt Etch, Aluminum Compatibility and (Undoped) NiPtSi Oxidation

| Example # | Formulation # | Total H+ Amount [moles] | Total Cl− or Br− Amount [moles] | Total NO3− Amount [moles] | Total Water Amount [moles] | NiPt Etch (1 to 10) | Al Corrosion and Pitting (1 to 10) | NiPtSi (undoped) Oxidization (1 to 10) blanket ΔRs | SEM-pad | ESCA - o profile |
|---|---|---|---|---|---|---|---|---|---|---|
| C63 | CFE39 | 1.49 | 0.011 (Cl− + 0.011 Br−) | 0.0795 | 3.38 | 9.5 | 5.5 | N/A | N/A | N/A |
| C64 | CFE41 | 0.0821 | 0.0027 | 0.0794 | 10.83 | 1 | 10 | 10 | N/A | N/A |
| C65 | CFE42 | 1.399 | 0.0402 | 0.3175 | 4.2 | 10 | 4 | 4 | 5 | 2 |
| 18 | FE6 | 1.52 | 0.0274 | 0.159 | 3.38 | 10 | 9 | 7 | 6 | N/A |
| 19 | FE7 | 1.47 | 0.011 | 0.0159 | 3.35 | 10 | 8.5 | 7.5 | 6 | 2 |
| 20 | FE8 | 1.49 | 0.011 | 0.0795 | 3.35 | 10 | 9 | 7.5 | 6.5 | 3 |
| 21 | FE11 | 1.32 | 0.011 | 0.0795 | 4.24 | 10 | 5.5 | 6.5 | 7 | 2 |
| 22 | FE12 | 1.66 | 0.011 | 0.0795 | 2.46 | 9.5 | 10 | 8.5 | 6.5 | N/A |
| 23 | FE13 | 1.82 | 0.011 | 0.0795 | 1.58 | 9 | 10 | 9 | 7.5 | 6 |
| 24 | FE14 | 1.99 | 0.011 | 0.0795 | 0.687 | 8 | 10 | 9.5 | 7.5 | 7 |
| 25 | FE15 | 1.57 | 0.011 | 0.3173 | 3.35 | 10 | 9 | 8 | N/A | 2.5 |
| 26 | FE16 | 1.68 | 0.011 | 0.635 | 3.35 | 10 | 7.5 | 8 | 4 | N/A |
| 27 | FE17 | 1.49 | 0.0055 | 0.0795 | 3.34 | 10 | 9.5 | 8 | 7 | 6 |
| 28 | FE18 | 1.49 | 0.0028 | 0.0795 | 3.34 | 9.5 | 9 | 5 | 6.5 | 7 |
| 29 | FE19 | 1.57 | 0.0028 | 0.317 | 3.34 | 10 | 8.5 | 8 | 4 | 8.5 |
| 30 | FE21 | 1.49 | 0.0016 | 0.0795 | 3.34 | 9.5 | N/A | N/A | 6.5 | 6 |
| 31 | FE22 | 1.48 | 0.0005 | 0.0795 | 3.33 | 9 | N/A | N/A | 7 | N/A |
| 32 | FE23 | 1.48 | 0.011 (Br−) | 0.0795 | 3.36 | 8 | 5.5 | N/A | N/A | N/A |
| 33 | FE26 | 1.434 | 0.0028 | 0.0794 | 3.37 | 9.5 | N/A | 8.5 | 7 | 7.5 |
| 34 | FE27 | 1.464 | 0.0028 | 0.0794 | 3.35 | 9.5 | 10 | 8.5 | 7 | 9 |
| 35 | FE28 | 1.476 | 0.0028 | 0.0794 | 3.35 | 9 | N/A | 8 | N/A | 7.5 |
| 36 | FE29 | 1.482 | 0.0028 | 0.0794 | 3.31 | 9.5 | N/A | N/A | 6 | N/A |
| 37 | FE30 | 1.518 | 0.0028 | 0.0794 | 3.11 | 9 | N/A | N/A | 4 | N/A |
| 38 | FE31 | 1.486 | 0.0028 | 0.0794 | 3.32 | 9 | 10 | 8.5 | 6 | 9 |
| 39 | FE32 | 1.426 | 0.0028 | 0.0794 | 3.34 | 9 | N/A | N/A | 6 | 8.5 |
| 40 | FE33 | 1.407 | 0.0028 | 0.0794 | 3.11 | 9 | N/A | N/A | 8 | N/A |

TABLE 5B

Ratings for Etchant Formulations in NiPt Etch, Aluminum Compatibility and (Doped) NiPtSi Oxidization

| Example # | Formulation # | Total H+ Amount [moles] | Total Cl− or Br− Amount [moles] | Total NO3− Amount [moles] | Total Water Amount [moles] | NiPt Etch (1 to 10) | Al Corrosion and Pitting (1 to 10) | NiPtSi (n-doped) Oxidization (1 to 10) SEM | ESCA o profile | blanket ΔRs | NiPtSi (p-doped) Oxidization (1 to 10) SEM |
|---|---|---|---|---|---|---|---|---|---|---|---|
| C66 | CFE21 | 0.979 | 0.219 | 0.222 | 7.02 | 10 | 8 | 1 | 1 | N/A | N/A |
| C67 | CFE42 | 1.399 | 0.0402 | 0.3175 | 4.2 | 9.5 | 4 | 2 | TBD | 1 |  |
| C68 | CFE43 | 1.418 | 0.0402 | 0.0794 | 3.35 | N/A | 2 | N/A | N/A | 1 | N/A |
| C69 | CFE44 | 0.476 | 1.186 | 0.476 | 4.78 | 1 | 1 | 1 | N/A | N/A | N/A |
| C70 | CFE45 | 1.360 | 0.0549 | 0.159 | 3.78 | N/A | 4 | N/A | N/A | 1 | N/A |
| 41 | FE18 | 1.49 | 0.0028 | 0.0795 | 3.34 | 9.5 | 9 | N/A | 5 | 6 | N/A |
| 42 | FE27 | 1.464 | 0.0028 | 0.0794 | 3.35 | 9.5 | 10 | 5 | 7 | 8 | 5 |
| 43 | FE29 | 1.482 | 0.0028 | 0.0794 | 3.31 | 9.5 | N/A | 5 | 6 | N/A | 5 |
| 44 | FE30 | 1.518 | 0.0028 | 0.0794 | 3.11 | 9 | N/A | 4 | 8.5 | N/A | 4 |
| 45 | FE31 | 1.486 | 0.0028 | 0.0794 | 3.32 | 9 | 10 | N/A | 8.5 | N/A | N/A |
| 46 | FE32 | 1.426 | 0.0028 | 0.0794 | 3.34 | 9 | N/A | 5 | 8 | N/A | 5 |
| 47 | FE33 | 1.407 | 0.0028 | 0.0794 | 3.11 | 9 | N/A | 5 | 7 | N/A | 5 |
| 48 | FE36 | 1.407 | 0.0027 | 0.3174 | 4.20 | N/A | 7 | N/A | N/A | 4 | N/A |
| 49 | FE37 | 1.538 | 0.0027 | 0.0794 | 3.11 | 9.5 | N/A | 7 | 8.5 | N/A | N/A |

Note to NiPt etch rating: 1=no NiPt removed; 10=all of the NiPt was removed
Note to Al corrosion and pitting rating: 1=Al layer was completely removed or High Al ER and Severe Al pitting; 10=Low Al ER and no Al pitting
Note to NiPtSi oxidization rating: 1=Highest NiPtSi sheet resistance change; 10=Lowest NiPtSi sheet resistance change
Note to ESCA rating: 1=Highest NiPtSi oxygen profile; 10=Lowest NiPtSi oxygen profile
Note to SEM Pad rating: 1=Lowest NiPtSi contrast uniformity; 10=Highest NiPtSi contrast uniformity
Note: N/A=data not available
Note: Acidity contribution calculation for H+ for contribution of all strong acids assuming full ionization
The above notes apply to both Tables 5A and 5B.

The data in Tables 3, 4, 5A and 5B show that the compositions of this disclosure, in general, surprisingly outperformed comparative compositions in one or more areas without significant underperformance in other critical areas in multiple environments. A lower Cl⁻ concentration (e.g., less than 0.5% of chloride) and/or a lower $NO_3^-$ concentration in the etch compositions of this disclosure generally resulted in a decrease of Al corrosion and NiPtSi oxidization. Formulations can be adjusted to give optimum results for etching depending on the specific metals present.

In addition, the results showed that using a mixture of a short chain alkylsulfonic acid (i.e., the first sulfonic acid) in combination with a more hydrophobic sulfonic acid (i.e., the second sulfonic acid) can have additional beneficial effects in decreasing Al corrosion and NiPtSi oxidation. Specifically, comparison of the ESCA oxidation ratings of FE15, FE18, FE26-FE28, FE31, and FE32, which have the same Cl⁻:nitrate ratio, shows that the formulations containing the above first and second sulfonic acids have higher oxidation ratings (i.e., less oxidation) than the samples without the second sulfonic acid.

Several comparative examples demonstrated the importance of specific components and/or ranges. For example, the results for Comparative Formulations CFE18 and CFE19 show that the absence of a halide or nitrate source produced low NiPt Etch rates. See, e.g., Comparative Examples C32 and C33. In addition, low halide and nitrate containing compositions likewise have low NiPt Etch rates, unless significant amounts of sulfonic acid are present in the formulation. See, e.g., Comparative Example C16. Comparison of formulations FE8, FE11, FE13, and FE14 (all having the same Cl⁻:nitrate ratio) shows that increasing the sulfonic acid content increases the blanket and ESCA oxidation rating (i.e., lower NiPtSi oxidation). See, e.g., Examples 20, 21, 23, and 24. Low halide and nitrate containing compositions also require at least a certain minimum level of water (e.g., at least about 3% of water) or the NiPt etch rate stays low. See, e.g., Example C60. Therefore, it is critical that all components required (i.e., at least one halide source, at least one nitrate source, at least one sulfonic acid, and water) are present and that a balance between these components (e.g., about 0.01%-0.5% chloride, about 0.1%-20% nitrate, and about 60%-95% sulfonic acid) is reached to achieve satisfactory NiPt etch rates, low metal corrosion, and low silicide oxidation.

TABLE 6

Other Material Compatibility with NiPt Etching Formulations

| | Formulation # | | | |
|---|---|---|---|---|
| | CFE21 | FE18 | FE18 | CFE40 |
| Etching Temperature C./Time (min) | 50/2 | 50/2 | 30/2 | 30/2 |
| NiPtSiC* | 23.3 | 0.4 | 0.3 | 40.2 |
| NiPtSiGe* | 0.6 | 0.1 | 0.1 | 2.1 |
| Etching Temperature C./Time (min) | 50/5 | 50/5 | 30/5 | 30/5 |
| TaN** | 0.1 | 0.0 | 0.3 | 0.1 |
| $HfO_2$** | 0.3 | 0.1 | 0.2 | 0.1 |
| $SiO_2$** | 1.0 | 1.0 | 1.0 | 1.0 |
| SiN** | 0.1 | 0.1 | 0.0 | 0.2 |
| W** | 21.3 | 0.0 | 0.1 | 63.5 |
| TiN** | 1.5 | 0.2 | 0.1 | 4.4 |

*ΔSheet Res [mΩ/sq];
**Etching rate [Å/min]

In addition, Formulation FE18 and Comparative Formulations CFE21 and CFE40 were tested under different conditions for their compatibility with materials that may be present when etching a metal substrate in a semiconductor device by using General Procedure 3. The results are summarized in Table 6.

As shown in Table 6, FE18 (i.e., a composition of this disclosure) performed significantly better than Comparative Formulations CFE21 and CFE40 in these compatibility tests.

Examples 50 to 60

Evaluation of Etching Formulations for NiPt Etch, Al Compatibility and NiPtSi Oxidization The etching formulations below are prepared according to General Procedure 1.

TABLE 7

Etching Compositions

| Example # | Acid Halide compound/ Amount [g] | Nitric Acid/ Amount [g] | Other Halide Source/ Amount [g] | Other Nitrate source/ Amount [g] | Sulfonic Acid/ Amount [g] | Water Added [g] | Total Water in all sources (g) |
|---|---|---|---|---|---|---|---|
| 50 | none | $HNO_3$ 7.143 | $NH_3(CH_3)Cl$ 0.185 | none | MSA 186.62 | | 60.13 |
| | | | | | PTSA 6.051 | | |
| 51 | HCl 0.054 | $HNO_3$ 7.143 | $NiCl_4$ 0.135 | none | MSA 171.62 | 15.0 | 70.67 |
| | | | | | PTSA 6.051 | | |
| 52 | none | $HNO_3$ 14.286 | $NiCl_4$ 0.135 | none | MSA 102 | 83.58 | 118.47 |
| 53 | HCl 0.30 | None | TMACl 0.150 | $TMANO_3$ 10.79 | MSA 179.37 | 3.34 | 59.34 |
| | | | | | PTSA 6.051 | | |
| 54 | HBr 0.222 | $HNO_3$ 7.143 | | | MSA 186.58 | | 60.12 |
| | | | | | PTSA 6.051 | | |
| 55 | HCl 0.054 | None | none | $NH_4NO_3$ 19.05 | MSA 180.91 | | 54.27 |
| 56 | HCl 0.27 | $HNO_3$ 7.143 | | | ESA 134.68 | 57.91 | 60 |
| 57 | HCl 2.7 | $HNO_3$ 7.143 | | | PTSA 190.16 | | 66.59 |
| 58 | HCl 0.27 | $HNO_3$ 7.143 | | | TFMSA 132.59 | 60 | 62.31 |
| 59 | HCl 0.27 | $HNO_3$ 7.143 | | | MSA 186.58 | | 58.76 |
| | | | | | NSA 6.051 | | |

TABLE 7-continued

Etching Compositions

| Example # | Acid Halide compound/ Amount [g] | Nitric Acid/ Amount [g] | Other Halide Source/ Amount [g] | Other Nitrate source/ Amount [g] | Sulfonic Acid/ Amount [g] | Water Added [g] | Total Water in all sources (g) |
|---|---|---|---|---|---|---|---|
| 60 | HCl 0.27 | | $(NO)BF_4$ 9.27 | | MSA 183.46 (100%) | 7 | 7.17 |

Notes:
Hydrochloric acid (HCl) is a 37% hydrochloric acid solution; Hydrobromic Acid (HBr) is a 48% acid solution; Nitric acid ($HNO_3$) is a 70% nitric acid solution; MSA is methanesulfonic acid which is a 70% methanesulfonic acid solution unless otherwise noted; PTSA is a 67% p-toluenesulfonic acid aqueous solution; ESA is a ethanesulfonic acid neat; TFMSA is a neat liquid containing trifluormethanesulfonic acid; NSA is 2-naphthalenesulfonic acid monohydrate; TMACl is a tetramethylammonium chloride anhydrous solid; $TMANO_3$ is a tetramethylammonium nitrate anhydrous solid; $NH_4NO_3$ is ammonium nitrate anhydrous solid. $N(CH_3)H_3Cl$ is methylammonium hydrochloride solid; $NiCl_4$ is nickel tetrachloride solid. In addition, the amount for each component in this table refers to the amount of the component as added to the composition, not the amount of the active ingredient in the component. For example, 2.7 g of HCl in Example 57 refers to 2.7 g of a 37% hydrochloric acid solution, not 2.7 g of pure HCl.

The formulations are tested using General Procedures 2-4. The formulations are expected to have a high NiPt etch rate, low aluminum etch rate, and minimal to acceptable degrees of oxidation of undoped, p-doped, and n-doped NiPt Silicide.

Due to the reactive nature of the compositions in this disclosure, a method of formulating two components that would be mixed together and then heated at point of use to give the final etching composition is preferred. This type of partitioning of the composition is done to separate the reactive chloride and nitrate components to improve shelf and storage life of the etching solutions. Depending on the final formulation, the partitioning into two mixtures, which upon mixing in a predetermined ratio gives the final formulation, can be accomplished in various ways. Two examples are shown below:

Example 61

FE18

| FE18 Final Formulation | |
|---|---|
| Components [wt %] | FE18 |
| Hydrochloric acid | 0.05% |
| Nitric acid | 2.5% |
| Methane sulfonic acid | 67.41% |
| Water | 30.04% |
| Total [wt %] | 100.00% |

| Two Component Mixing Method for Example 61 | | |
|---|---|---|
| FE18; 1:1 Weight Mix A:B | Component A | Component B |
| HCl | 0.100% | 0.000% |
| $HNO_3$ | 0.000% | 5.000% |
| MSA | 69.811% | 65.000% |
| Water | 30.089% | 30.000% |

Example 62

FE27

| FE-27 Final Formulation | |
|---|---|
| Components [wt %] | FE27 |
| Hydrochloric acid | 0.05% |
| Nitric acid | 2.5% |
| Methane sulfonic acid | 65.287% |
| p-Toluenesulfonic Acid | 2.00% |
| Water | 30.16% |
| Total [wt %] | 100.00% |

| Two Component Mixing Method for Example 62 | | |
|---|---|---|
| FE-27; 1:1 Weight Mix A:B | Component A | Component B |
| HCl | 0.100% | 0.000% |
| $HNO_3$ | 0.000% | 5.000% |
| MSA | 69.811% | 60.760% |
| p-Toluenesulfonic Acid | 0.00% | 4.00% |
| Water | 30.089% | 30.240% |

Examples 63 and 64

Evaluation of an Etching Formulation on Au and Pd

Films of Au on a Si substrate (Example 63) and Pd on a Si substrate (Example 64) are etched according to procedures in General Procedure 2 using formulation FE15. The Au and Pd films are expected to exhibit a high etch rate when etched by formulation FE15.

While the present disclosure has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

What is claimed is:

1. A kit for facilitating etching of NiPt during manufacturing a semiconductor device, comprising:
   at least one sulfonic acid in a first container;
   at least one compound containing a halide anion in a second container, the halide anion being chloride or bromide; and
   at least one compound containing a nitrate or nitrosyl ion in a third container;
   wherein the second container is different from the third container and wherein the kit is essentially free of thiocarbonyl compounds.

2. The kit of claim 1, wherein the first container is the same as the second or third container.

3. The kit of claim 1, wherein the first container is different from the second and third containers.

4. The kit of claim 1, wherein the kit further comprises an instruction for mixing the at least one sulfonic acid, the at least one compound containing the halide anion, and the at least one compound containing a nitrate or nitrosyl ion to prepare an etching composition.

5. The kit of claim 1, wherein the third container contains a nitrosyl ion.

6. The kit of claim 1, wherein, after mixing the contents in the first, second, and third containers to form a mixture, the mixture comprises the at least one sulfonic acid, the halide ion, and the nitrate or nitrosyl ion at a weight ratio of about 25 to about 95:about 0.01 to about 0.5:about 0.1 to about 20.

7. The kit of claim 1, wherein the at least one sulfonic acid comprises a compound of formula (1):

in which $R^1$ is substituted or unsubstituted $C_1$-$C_{12}$ linear or branched alkyl, substituted or unsubstituted $C_3$-$C_{12}$ cyclic alkyl, $C_1$-$C_{12}$ linear or branched fluoroalkyl ether, or $C_3$-$C_{12}$ cyclic fluoroalkyl ether.

8. The kit of claim 7, wherein $R^1$ is $C_1$-$C_{12}$ linear or branched alkyl or $C_3$-$C_{12}$ cyclic alkyl, each of which is optionally substituted with halogen, $C_1$-$C_4$ alkyl, sulfonic acid, or phenyl optionally substituted with $C_1$-$C_4$ alkyl or hydroxy.

9. The kit of claim 8, wherein the at least one sulfonic acid is methanesulfonic acid.

10. The kit of claim 1, wherein the at least one sulfonic acid comprises a compound of formula (2):

in which
   each of $R^2$, $R^3$, and $R^4$, independently, is $C_1$-$C_{12}$ linear or branched alkyl, $C_3$-$C_{12}$ cyclic alkyl, F, Cl, Br, OH, $NO_2$, $SO_3H$, or $CO_2H$;
   $R^5$ is H; and
   each of a, b, c, and n, independently, is 0, 1, 2, or 3 provided that the sum of a, b, and c is n.

11. The kit of claim 10, wherein each of $R^2$, $R^3$, and $R^4$, independently, is $C_1$-$C_2$ alkyl, Cl, $NO_2$, OH, F, or $CO_2H$; and n is 0 or 1.

12. The kit of claim 1, wherein the at least one sulfonic acid comprises a naphthalenesulfonic acid optionally substituted with $C_1$-$C_{12}$ linear or branched alkyl or $SO_3H$.

13. The kit of claim 1, wherein the first container comprises a first sulfonic acid and a second sulfonic acid.

14. The kit of claim 13, wherein the first sulfonic acid comprises a compound of formula (1):

in which $R^1$ is unsubstituted $C_1$-$C_4$ linear or branched alkyl.

15. The kit of claim 14, wherein the second sulfonic acid comprises a compound of formula (2):

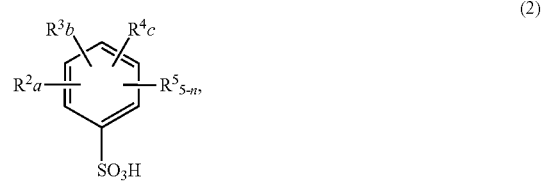

in which
   each of $R^2$, $R^3$, and $R^4$, independently, is $C_1$-$C_{12}$ linear or branched alkyl, $C_3$-$C_{12}$ cyclic alkyl, F, Cl, or Br;
   $R^5$ is H; and
   each of a, b, c, and n, independently, is 0, 1, 2, or 3 provided that the sum of a, b, and c is n.

16. The kit of claim 13, wherein the second sulfonic acid comprises a compound of formula (1):

in which $R^1$ is substituted or unsubstituted $C_6$-$C_{12}$ linear or branched alkyl, substituted or unsubstituted $C_6$-$C_{12}$ cyclic alkyl, $C_1$-$C_{12}$ linear or branched perfluoroalkyl, $C_3$-$C_{12}$ cyclic perfluoroalkyl, $C_1$-$C_{12}$ linear or branched fluoroalkyl ether, $C_3$-$C_{12}$ cyclic fluoroalkyl ether, or substituted or unsubstituted $C_7$-$C_{12}$ alicyclic groups.

17. The kit of claim 13, wherein the second sulfonic acid comprises a naphthalenesulfonic acid optionally substituted with $C_1$-$C_{12}$ linear or branched alkyl or $SO_3H$.

18. The kit of claim 1, wherein the at least one compound containing a halide ion comprises hydrogen chloride, hydrogen bromide, ammonium chloride, ammonium bromide, a quaternary ammonium chloride, a quaternary ammonium bromide, an amine hydrochloride, an amine hydrobromide, a nitrogen based aromatic and pseudoaromatic hydrochloride, a nitrogen based aromatic and pseudoaromatic hydrobromide, a phosphonium chloride, a phosphonium bromide, a metal chloride, or a metal bromide.

19. The kit of claim 18, wherein the at least one compound containing a halide ion comprises hydrogen chloride, ammonium chloride, ammonium bromide, or a quaternary ammonium chloride.

20. The kit of claim 1, wherein the at least one compound containing a nitrate or nitrosyl ion comprises nitric acid, ammonium nitrate, a quaternary ammonium nitrate, a substituted ammonium nitrate, a nitrogen based aromatic and pseudoaromatic reaction product with nitric acid, a phosphonium nitrate, a metal nitrate, nitrosyl chloride, nitrosyl bromide, nitrosyl fluoride, nitrosyl tetrafluoroborate, or nitrosyl hydrogen sulfate.

21. The kit of claim 20, wherein the at least one compound containing a nitrate or nitrosyl ion comprises nitric acid.

* * * * *